(12) United States Patent
Iandola et al.

(10) Patent No.: US 11,487,288 B2
(45) Date of Patent: Nov. 1, 2022

(54) DATA SYNTHESIS FOR AUTONOMOUS CONTROL SYSTEMS

(71) Applicant: Tesla, Inc., Austin, TX (US)

(72) Inventors: Forrest Nelson Iandola, San Jose, CA (US); Donald Benton MacMillen, Hillsborough, CA (US); Anting Shen, Berkeley, CA (US); Harsimran Singh Sidhu, Fremont, CA (US); Paras Jagdish Jain, Cupertino, CA (US)

(73) Assignee: Tesla, Inc., Austin, TX (US)

(*) Notice: Subject to any disclaimer, the term of this patent is extended or adjusted under 35 U.S.C. 154(b) by 239 days.

(21) Appl. No.: 16/895,204

(22) Filed: Jun. 8, 2020

(65) Prior Publication Data
US 2020/0401136 A1 Dec. 24, 2020

Related U.S. Application Data

(63) Continuation of application No. 15/934,899, filed on Mar. 23, 2018, now Pat. No. 10,678,244.
(Continued)

(51) Int. Cl.
G05D 1/00 (2006.01)
B60R 11/04 (2006.01)
(Continued)

(52) U.S. Cl.
CPC ............ G05D 1/0088 (2013.01); B60R 11/04 (2013.01); B60W 40/02 (2013.01); G06F 30/20 (2020.01);
(Continued)

(58) Field of Classification Search
CPC .......... G05D 1/0088; G05D 2201/0213; B60R 11/04; B60R 2300/301; B60W 40/02;
(Continued)

(56) References Cited

U.S. PATENT DOCUMENTS 6,882,755 B2 5/2005 Silverstein et al.
7,209,031 B2 4/2007 Nakai et al.
(Continued)

FOREIGN PATENT DOCUMENTS

AU 2019261735 A1 6/2020
AU 2019201716 A1 10/2020
(Continued)

OTHER PUBLICATIONS

PCT International Search Report and Written Opinion, PCT Application No. PCT/US18/24197, dated Jun. 6, 2018, 15 pages.

*Primary Examiner* — Aaron L Troost
(74) *Attorney, Agent, or Firm* — Knobbe, Martens, Olson & Bear, LLP

(57) ABSTRACT

An autonomous control system generates synthetic data that reflect simulated environments. Specifically, the synthetic data is a representation of sensor data of the simulated environment from the perspective of one or more sensors. The system generates synthetic data by introducing one or more simulated modifications to sensor data captured by the sensors or by simulating the sensor data for a virtual environment. The autonomous control system uses the synthetic data to train computer models for various detection and control algorithms. In general, this allows autonomous control systems to augment training data to improve performance of computer models, simulate scenarios that are not included in existing training data, and/or train computer models that remove unwanted effects or occlusions from sensor data of the environment.

20 Claims, 6 Drawing Sheets

Related U.S. Application Data

(60) Provisional application No. 62/475,792, filed on Mar. 23, 2017.

(51) Int. Cl.
    *B60W 40/02* (2006.01)
    *G06F 30/20* (2020.01)
    *G06K 9/62* (2022.01)
    *G06V 20/58* (2022.01)
    *G06F 30/15* (2020.01)

(52) U.S. Cl.
    CPC ......... *G06K 9/6257* (2013.01); *G06K 9/6268* (2013.01); *G06V 20/58* (2022.01); *B60R 2300/301* (2013.01); *G05D 2201/0213* (2013.01); *G06F 30/15* (2020.01)

(58) Field of Classification Search
    CPC ....... G06F 30/20; G06F 30/15; G06K 9/6257; G06K 9/6268; G06V 20/58; G06V 10/82
    See application file for complete search history.

(56) References Cited

U.S. PATENT DOCUMENTS

| | | |
|---|---|---|
| 7,747,070 B2 | 6/2010 | Puri |
| 7,904,867 B2 | 3/2011 | Burch et al. |
| 7,974,492 B2 | 7/2011 | Nishijima |
| 8,165,380 B2 | 4/2012 | Choi et al. |
| 8,369,633 B2 | 2/2013 | Lu et al. |
| 8,406,515 B2 | 3/2013 | Cheatle et al. |
| 8,509,478 B2 | 8/2013 | Haas et al. |
| 8,588,470 B2 | 11/2013 | Rodriguez et al. |
| 8,744,174 B2 | 6/2014 | Hamada et al. |
| 8,773,498 B2 | 7/2014 | Lindbergh |
| 8,912,476 B2 | 12/2014 | Fogg et al. |
| 8,913,830 B2 | 12/2014 | Sun et al. |
| 8,928,753 B2 | 1/2015 | Han et al. |
| 8,972,095 B2 | 3/2015 | Furuno et al. |
| 8,976,269 B2 | 3/2015 | Duong |
| 9,008,422 B2 | 4/2015 | Eid et al. |
| 9,081,385 B1 | 7/2015 | Ferguson et al. |
| 9,275,289 B2 | 3/2016 | Li et al. |
| 9,586,455 B2 | 3/2017 | Sugai et al. |
| 9,672,437 B2 | 6/2017 | McCarthy |
| 9,710,696 B2 | 7/2017 | Wang et al. |
| 9,738,223 B2 | 8/2017 | Zhang et al. |
| 9,754,154 B2 | 9/2017 | Craig et al. |
| 9,767,369 B2 | 9/2017 | Furman et al. |
| 9,836,895 B1 * | 12/2017 | Nygaard ............ G05D 1/0088 |
| 9,965,865 B1 | 5/2018 | Agrawal et al. |
| 10,133,273 B2 | 11/2018 | Linke |
| 10,140,252 B2 | 11/2018 | Fowers et al. |
| 10,140,544 B1 | 11/2018 | Zhao et al. |
| 10,146,225 B2 | 12/2018 | Ryan |
| 10,152,655 B2 | 12/2018 | Krishnamurthy et al. |
| 10,167,800 B1 | 1/2019 | Chung et al. |
| 10,169,680 B1 | 1/2019 | Sachdeva et al. |
| 10,192,016 B2 | 1/2019 | Ng et al. |
| 10,216,189 B1 | 2/2019 | Haynes |
| 10,228,693 B2 | 3/2019 | Micks et al. |
| 10,242,293 B2 | 3/2019 | Shim et al. |
| 10,248,121 B2 | 4/2019 | Vandenberg, III |
| 10,262,218 B2 | 4/2019 | Lee et al. |
| 10,282,623 B1 | 5/2019 | Ziyaee et al. |
| 10,296,828 B2 | 5/2019 | Viswanathan |
| 10,303,961 B1 | 5/2019 | Stoffel et al. |
| 10,310,087 B2 | 6/2019 | Laddha et al. |
| 10,311,312 B2 | 6/2019 | Yu et al. |
| 10,318,848 B2 | 6/2019 | Dijkman et al. |
| 10,325,178 B1 | 6/2019 | Tang et al. |
| 10,331,974 B2 | 6/2019 | Zia et al. |
| 10,338,600 B2 | 7/2019 | Yoon et al. |
| 10,343,607 B2 | 7/2019 | Kumon et al. |
| 10,359,783 B2 | 7/2019 | Williams et al. |
| 10,366,290 B2 | 7/2019 | Wang et al. |
| 10,372,130 B1 | 8/2019 | Kaushansky et al. |
| 10,373,019 B2 | 8/2019 | Nariyambut Murali et al. |
| 10,373,026 B1 | 8/2019 | Kim et al. |
| 10,380,741 B2 | 8/2019 | Yedla et al. |
| 10,394,237 B2 | 8/2019 | Xu et al. |
| 10,395,144 B2 | 8/2019 | Zeng et al. |
| 10,402,646 B2 | 9/2019 | Klaus |
| 10,402,986 B2 | 9/2019 | Ray et al. |
| 10,414,395 B1 | 9/2019 | Sapp et al. |
| 10,423,934 B1 | 9/2019 | Zanghi et al. |
| 10,436,615 B2 | 10/2019 | Agarwal et al. |
| 10,452,905 B2 | 10/2019 | Segalovitz et al. |
| 10,460,053 B2 | 10/2019 | Olson et al. |
| 10,467,459 B2 | 11/2019 | Chen et al. |
| 10,468,008 B2 | 11/2019 | Beckman et al. |
| 10,468,062 B1 | 11/2019 | Levinson et al. |
| 10,470,510 B1 | 11/2019 | Koh et al. |
| 10,474,160 B2 | 11/2019 | Huang et al. |
| 10,474,161 B2 | 11/2019 | Huang et al. |
| 10,474,928 B2 | 11/2019 | Sivakumar et al. |
| 10,489,126 B2 | 11/2019 | Kumar et al. |
| 10,489,972 B2 | 11/2019 | Atsmon |
| 10,503,971 B1 | 12/2019 | Dang et al. |
| 10,514,711 B2 | 12/2019 | Bar-Nahum et al. |
| 10,528,824 B2 | 1/2020 | Zou |
| 10,529,078 B2 | 1/2020 | Abreu et al. |
| 10,529,088 B2 | 1/2020 | Fine et al. |
| 10,534,854 B2 | 1/2020 | Sharma et al. |
| 10,535,191 B2 | 1/2020 | Sachdeva et al. |
| 10,542,930 B1 | 1/2020 | Sanchez et al. |
| 10,546,197 B2 | 1/2020 | Shrestha et al. |
| 10,546,217 B2 | 1/2020 | Albright et al. |
| 10,552,682 B2 | 2/2020 | Jonsson et al. |
| 10,559,386 B1 | 2/2020 | Neuman |
| 10,565,475 B2 | 2/2020 | Lecue et al. |
| 10,567,674 B2 | 2/2020 | Kirsch |
| 10,568,570 B1 | 2/2020 | Sherpa et al. |
| 10,572,717 B1 | 2/2020 | Zhu et al. |
| 10,574,905 B2 | 2/2020 | Srikanth et al. |
| 10,579,058 B2 | 3/2020 | Oh et al. |
| 10,579,063 B2 | 3/2020 | Haynes et al. |
| 10,579,897 B2 | 3/2020 | Redmon et al. |
| 10,586,280 B2 | 3/2020 | McKenna et al. |
| 10,591,914 B2 | 3/2020 | Palanisamy et al. |
| 10,592,785 B2 | 3/2020 | Zhu et al. |
| 10,599,701 B2 | 3/2020 | Liu |
| 10,599,930 B2 | 3/2020 | Lee et al. |
| 10,599,958 B2 | 3/2020 | He et al. |
| 10,606,990 B2 | 3/2020 | Tuli et al. |
| 10,609,434 B2 | 3/2020 | Singhai et al. |
| 10,614,344 B2 | 4/2020 | Anthony et al. |
| 10,621,513 B2 | 4/2020 | Deshpande et al. |
| 10,627,818 B2 | 4/2020 | Sapp et al. |
| 10,628,432 B2 | 4/2020 | Guo et al. |
| 10,628,686 B2 | 4/2020 | Ogale et al. |
| 10,628,688 B1 | 4/2020 | Kim et al. |
| 10,629,080 B2 | 4/2020 | Kazemi et al. |
| 10,636,161 B2 | 4/2020 | Uchigaito |
| 10,636,169 B2 | 4/2020 | Estrada et al. |
| 10,642,275 B2 | 5/2020 | Silva et al. |
| 10,645,344 B2 | 5/2020 | Marman et al. |
| 10,649,464 B2 | 5/2020 | Gray |
| 10,650,071 B2 | 5/2020 | Asgekar et al. |
| 10,652,565 B1 | 5/2020 | Zhang et al. |
| 10,656,657 B2 | 5/2020 | Djuric et al. |
| 10,657,391 B2 | 5/2020 | Chen et al. |
| 10,657,418 B2 | 5/2020 | Marder et al. |
| 10,657,934 B1 | 5/2020 | Kolen et al. |
| 10,661,902 B1 | 5/2020 | Tavshikar |
| 10,664,750 B2 | 5/2020 | Greene |
| 10,671,082 B2 | 6/2020 | Huang et al. |
| 10,671,886 B2 | 6/2020 | Price et al. |
| 10,678,244 B2 | 6/2020 | Iandola et al. |
| 10,678,839 B2 | 6/2020 | Gordon et al. |
| 10,678,997 B2 | 6/2020 | Ahuja et al. |
| 10,679,129 B2 | 6/2020 | Baker |
| 10,685,159 B2 | 6/2020 | Su et al. |
| 10,685,188 B1 | 6/2020 | Zhang et al. |

(56) References Cited

U.S. PATENT DOCUMENTS

| | | |
|---|---|---|
| 10,692,000 B2 | 6/2020 | Surazhsky et al. |
| 10,692,242 B1 | 6/2020 | Morrison et al. |
| 10,693,740 B2 | 6/2020 | Coccia et al. |
| 10,698,868 B2 | 6/2020 | Guggilla et al. |
| 10,699,119 B2 | 6/2020 | Lo et al. |
| 10,699,140 B2 | 6/2020 | Kench et al. |
| 10,699,477 B2 | 6/2020 | Levinson et al. |
| 10,713,502 B2 | 7/2020 | Tiziani |
| 10,719,759 B2 | 7/2020 | Kutliroff |
| 10,725,475 B2 | 7/2020 | Yang et al. |
| 10,726,264 B2 | 7/2020 | Sawhney et al. |
| 10,726,279 B1 | 7/2020 | Kim et al. |
| 10,726,374 B1 | 7/2020 | Engineer et al. |
| 10,732,261 B1 | 8/2020 | Wang et al. |
| 10,733,262 B2 | 8/2020 | Miller et al. |
| 10,733,482 B1 | 8/2020 | Lee et al. |
| 10,733,638 B1 | 8/2020 | Jain et al. |
| 10,733,755 B2 | 8/2020 | Liao et al. |
| 10,733,876 B2 | 8/2020 | Moura et al. |
| 10,740,563 B2 | 8/2020 | Dugan |
| 10,740,914 B2 | 8/2020 | Xiao et al. |
| 10,748,062 B2 | 8/2020 | Rippel et al. |
| 10,748,247 B2 | 8/2020 | Paluri |
| 10,751,879 B2 | 8/2020 | Li et al. |
| 10,755,112 B2 | 8/2020 | Mabuchi |
| 10,755,575 B2 | 8/2020 | Johnston |
| 10,757,330 B2 | 8/2020 | Ashrafi |
| 10,762,396 B2 | 9/2020 | Vallespi et al. |
| 10,768,628 B2 | 9/2020 | Martin et al. |
| 10,768,629 B2 | 9/2020 | Song et al. |
| 10,769,446 B2 | 9/2020 | Chang et al. |
| 10,769,483 B2 | 9/2020 | Nirenberg et al. |
| 10,769,493 B2 | 9/2020 | Yu et al. |
| 10,769,494 B2 | 9/2020 | Xiao et al. |
| 10,769,525 B2 | 9/2020 | Redding et al. |
| 10,776,626 B1 | 9/2020 | Lin et al. |
| 10,776,673 B2 | 9/2020 | Kim et al. |
| 10,776,939 B2 | 9/2020 | Ma et al. |
| 10,779,760 B2 | 9/2020 | Lee et al. |
| 10,783,381 B2 | 9/2020 | Yu et al. |
| 10,783,454 B2 | 9/2020 | Shoaib et al. |
| 10,789,402 B1 | 9/2020 | Vemuri et al. |
| 10,789,544 B2 | 9/2020 | Fiedel et al. |
| 10,790,919 B1 | 9/2020 | Kolen et al. |
| 10,796,221 B2 | 10/2020 | Zhang et al. |
| 10,796,355 B1 | 10/2020 | Price et al. |
| 10,796,423 B2 | 10/2020 | Goja |
| 10,798,368 B2 | 10/2020 | Briggs et al. |
| 10,803,325 B2 | 10/2020 | Bai et al. |
| 10,803,328 B1 | 10/2020 | Bai et al. |
| 10,803,743 B2 | 10/2020 | Abari et al. |
| 10,805,629 B2 | 10/2020 | Liu et al. |
| 10,809,730 B2 | 10/2020 | Chintakindi |
| 10,810,445 B1 | 10/2020 | Kangaspunta |
| 10,816,346 B2 | 10/2020 | Wheeler et al. |
| 10,816,992 B2 | 10/2020 | Chen |
| 10,817,731 B2 | 10/2020 | Vallespi et al. |
| 10,817,732 B2 | 10/2020 | Porter et al. |
| 10,819,923 B1 | 10/2020 | McCauley et al. |
| 10,824,122 B2 | 11/2020 | Mummadi et al. |
| 10,824,862 B2 | 11/2020 | Qi et al. |
| 10,828,790 B2 | 11/2020 | Nemallan |
| 10,832,057 B2 | 11/2020 | Chan et al. |
| 10,832,093 B1 | 11/2020 | Taralova et al. |
| 10,832,414 B2 | 11/2020 | Pfeiffer |
| 10,832,418 B1 | 11/2020 | Karasev et al. |
| 10,833,785 B1 | 11/2020 | O'Shea et al. |
| 10,836,379 B2 | 11/2020 | Xiao et al. |
| 10,838,936 B2 | 11/2020 | Cohen |
| 10,839,230 B2 | 11/2020 | Charette et al. |
| 10,839,578 B2 | 11/2020 | Coppersmith et al. |
| 10,843,628 B2 | 11/2020 | Kawamoto et al. |
| 10,845,820 B2 | 11/2020 | Wheeler |
| 10,845,943 B1 | 11/2020 | Ansari et al. |
| 10,846,831 B2 | 11/2020 | Raduta |
| 10,846,888 B2 | 11/2020 | Kaplanyan et al. |
| 10,853,670 B2 | 12/2020 | Sholingar et al. |
| 10,853,739 B2 | 12/2020 | Truong et al. |
| 10,860,919 B2 | 12/2020 | Kanazawa et al. |
| 10,860,924 B2 | 12/2020 | Burger |
| 10,867,444 B2 | 12/2020 | Russell et al. |
| 10,871,444 B2 | 12/2020 | Al et al. |
| 10,871,782 B2 | 12/2020 | Milstein et al. |
| 10,872,204 B2 | 12/2020 | Zhu et al. |
| 10,872,254 B2 | 12/2020 | Mangla et al. |
| 10,872,326 B2 | 12/2020 | Garner |
| 10,872,531 B2 | 12/2020 | Liu et al. |
| 10,885,083 B2 | 1/2021 | Moeller-Bertram et al. |
| 10,887,433 B2 | 1/2021 | Fu et al. |
| 10,890,898 B2 | 1/2021 | Akella et al. |
| 10,891,715 B2 | 1/2021 | Li |
| 10,891,735 B2 | 1/2021 | Yang et al. |
| 10,893,070 B2 | 1/2021 | Wang et al. |
| 10,893,107 B1 | 1/2021 | Callari et al. |
| 10,896,763 B2 | 1/2021 | Kempanna et al. |
| 10,901,416 B2 | 1/2021 | Khanna et al. |
| 10,901,508 B2 | 1/2021 | Laszlo et al. |
| 10,902,551 B1 | 1/2021 | Mellado et al. |
| 10,908,068 B2 | 2/2021 | Amer et al. |
| 10,908,606 B2 | 2/2021 | Stein et al. |
| 10,909,368 B2 | 2/2021 | Guo et al. |
| 10,909,453 B1 | 2/2021 | Myers et al. |
| 10,915,783 B1 | 2/2021 | Hallman et al. |
| 10,917,522 B2 | 2/2021 | Segalis et al. |
| 10,921,817 B1 | 2/2021 | Kangaspunta |
| 10,922,578 B2 | 2/2021 | Banerjee et al. |
| 10,924,661 B2 | 2/2021 | Vasconcelos et al. |
| 10,928,508 B2 | 2/2021 | Swaminathan |
| 10,929,757 B2 | 2/2021 | Baker et al. |
| 10,930,065 B2 | 2/2021 | Grant et al. |
| 10,936,908 B1 | 3/2021 | Ho et al. |
| 10,937,186 B2 | 3/2021 | Wang et al. |
| 10,943,101 B2 | 3/2021 | Agarwal et al. |
| 10,943,132 B2 | 3/2021 | Wang et al. |
| 10,943,355 B2 | 3/2021 | Fagg et al. |
| 2003/0035481 A1 | 2/2003 | Hahm |
| 2003/0146869 A1 | 8/2003 | Lin et al. |
| 2005/0162445 A1 | 7/2005 | Sheasby et al. |
| 2006/0072847 A1 | 4/2006 | Chor et al. |
| 2006/0224533 A1 | 10/2006 | Thaler |
| 2006/0280364 A1 | 12/2006 | Ma et al. |
| 2007/0280528 A1 | 12/2007 | Wellington et al. |
| 2009/0016571 A1 | 1/2009 | Tijerina et al. |
| 2010/0106356 A1 | 4/2010 | Trepagnier et al. |
| 2010/0118157 A1 | 5/2010 | Kameyama |
| 2012/0109915 A1 | 5/2012 | Kamekawa |
| 2012/0110491 A1 | 5/2012 | Cheung |
| 2012/0134595 A1 | 5/2012 | Fonseca et al. |
| 2015/0104102 A1 | 4/2015 | Carreira et al. |
| 2015/0317284 A1 | 11/2015 | Takahashi |
| 2016/0132786 A1 | 5/2016 | Balan et al. |
| 2016/0210382 A1 | 7/2016 | Alaniz et al. |
| 2016/0210775 A1 | 7/2016 | Alaniz et al. |
| 2016/0314224 A1* | 10/2016 | Wei .................... G05D 1/0088 |
| 2016/0328856 A1 | 11/2016 | Mannino et al. |
| 2017/0011281 A1 | 1/2017 | Dihkman et al. |
| 2017/0123428 A1 | 5/2017 | Levinson et al. |
| 2017/0158134 A1 | 6/2017 | Shigemura |
| 2017/0206434 A1 | 7/2017 | Nariyambut et al. |
| 2018/0012411 A1 | 1/2018 | Richey et al. |
| 2018/0018527 A1* | 1/2018 | Micks .................... G06V 20/58 |
| 2018/0018590 A1 | 1/2018 | Szeto et al. |
| 2018/0039853 A1 | 2/2018 | Liu et al. |
| 2018/0067489 A1 | 3/2018 | Oder et al. |
| 2018/0068459 A1 | 3/2018 | Zhang et al. |
| 2018/0068540 A1 | 3/2018 | Romanenko et al. |
| 2018/0074506 A1 | 3/2018 | Branson |
| 2018/0121762 A1 | 5/2018 | Han et al. |
| 2018/0150081 A1 | 5/2018 | Gross et al. |
| 2018/0211403 A1 | 7/2018 | Hotson et al. |
| 2018/0308012 A1 | 10/2018 | Mummadi et al. |
| 2018/0314878 A1 | 11/2018 | Lee et al. |
| 2018/0357511 A1 | 12/2018 | Misra et al. |
| 2018/0374105 A1 | 12/2018 | Azout et al. |

(56) References Cited

U.S. PATENT DOCUMENTS

| | | |
|---|---|---|
| 2019/0023277 A1 | 1/2019 | Roger et al. |
| 2019/0025773 A1 | 1/2019 | Yang et al. |
| 2019/0042894 A1 | 2/2019 | Anderson |
| 2019/0042919 A1 | 2/2019 | Peysakhovich et al. |
| 2019/0042944 A1 | 2/2019 | Nair et al. |
| 2019/0042948 A1 | 2/2019 | Lee et al. |
| 2019/0057314 A1 | 2/2019 | Julian et al. |
| 2019/0065637 A1 | 2/2019 | Bogdoll et al. |
| 2019/0072978 A1 | 3/2019 | Levi |
| 2019/0079526 A1 | 3/2019 | Vallespi et al. |
| 2019/0080602 A1 | 3/2019 | Rice et al. |
| 2019/0095780 A1 | 3/2019 | Zhong et al. |
| 2019/0095946 A1 | 3/2019 | Azout et al. |
| 2019/0101914 A1 | 4/2019 | Coleman et al. |
| 2019/0108417 A1 | 4/2019 | Talagala et al. |
| 2019/0122111 A1 | 4/2019 | Min et al. |
| 2019/0130255 A1 | 5/2019 | Yim et al. |
| 2019/0145765 A1 | 5/2019 | Luo et al. |
| 2019/0146497 A1 | 5/2019 | Urtasun et al. |
| 2019/0147112 A1 | 5/2019 | Gordon |
| 2019/0147250 A1 | 5/2019 | Zhang et al. |
| 2019/0147254 A1 | 5/2019 | Bai et al. |
| 2019/0147255 A1 | 5/2019 | Homayounfar et al. |
| 2019/0147335 A1 | 5/2019 | Wang et al. |
| 2019/0147372 A1 | 5/2019 | Luo et al. |
| 2019/0158784 A1 | 5/2019 | Ahn et al. |
| 2019/0180154 A1 | 6/2019 | Orlov et al. |
| 2019/0185010 A1 | 6/2019 | Ganguli et al. |
| 2019/0189251 A1 | 6/2019 | Horiuchi et al. |
| 2019/0197357 A1 | 6/2019 | Anderson et al. |
| 2019/0204842 A1 | 7/2019 | Jafari et al. |
| 2019/0205402 A1 | 7/2019 | Sernau et al. |
| 2019/0205667 A1 | 7/2019 | Avidan et al. |
| 2019/0217791 A1 | 7/2019 | Bradley et al. |
| 2019/0227562 A1 | 7/2019 | Mohammadiha et al. |
| 2019/0228037 A1 | 7/2019 | Nicol et al. |
| 2019/0230282 A1 | 7/2019 | Sypitkowski et al. |
| 2019/0235499 A1 | 8/2019 | Kazemi et al. |
| 2019/0236437 A1 | 8/2019 | Shin et al. |
| 2019/0243371 A1 | 8/2019 | Nister et al. |
| 2019/0244138 A1 | 8/2019 | Bhowmick et al. |
| 2019/0250622 A1 | 8/2019 | Nister et al. |
| 2019/0250626 A1 | 8/2019 | Ghafarianzadeh et al. |
| 2019/0250640 A1 | 8/2019 | O'Flaherty et al. |
| 2019/0258878 A1 | 8/2019 | Koivisto et al. |
| 2019/0266418 A1 | 8/2019 | Xu et al. |
| 2019/0266610 A1 | 8/2019 | Ghatage et al. |
| 2019/0272446 A1 | 9/2019 | Kangaspunta et al. |
| 2019/0276041 A1 | 9/2019 | Choi et al. |
| 2019/0279004 A1 | 9/2019 | Kwon et al. |
| 2019/0286652 A1 | 9/2019 | Habbecke et al. |
| 2019/0286972 A1 | 9/2019 | El Husseini et al. |
| 2019/0287028 A1 | 9/2019 | St Amant et al. |
| 2019/0289281 A1 | 9/2019 | Badrinarayanan et al. |
| 2019/0294177 A1 | 9/2019 | Kwon et al. |
| 2019/0294975 A1 | 9/2019 | Sachs |
| 2019/0311290 A1 | 10/2019 | Huang et al. |
| 2019/0318099 A1 | 10/2019 | Carvalho et al. |
| 2019/0325088 A1 | 10/2019 | Dubey et al. |
| 2019/0325266 A1 | 10/2019 | Klepper et al. |
| 2019/0325269 A1 | 10/2019 | Bagherinezhad et al. |
| 2019/0325580 A1 | 10/2019 | Lukac et al. |
| 2019/0325595 A1 | 10/2019 | Stein et al. |
| 2019/0329790 A1 | 10/2019 | Nandakumar et al. |
| 2019/0332875 A1 | 10/2019 | Vallespi-Gonzalez et al. |
| 2019/0333232 A1 | 10/2019 | Vallespi-Gonzalez et al. |
| 2019/0336063 A1 | 11/2019 | Dascalu |
| 2019/0339989 A1 | 11/2019 | Liang et al. |
| 2019/0340462 A1 | 11/2019 | Pao et al. |
| 2019/0340492 A1 | 11/2019 | Burger et al. |
| 2019/0340499 A1 | 11/2019 | Burger et al. |
| 2019/0347501 A1 | 11/2019 | Kim et al. |
| 2019/0349571 A1 | 11/2019 | Herman et al. |
| 2019/0354782 A1 | 11/2019 | Kee et al. |
| 2019/0354786 A1 | 11/2019 | Lee et al. |
| 2019/0354808 A1 | 11/2019 | Park et al. |
| 2019/0354817 A1 | 11/2019 | Shiens et al. |
| 2019/0354850 A1 | 11/2019 | Watson et al. |
| 2019/0370398 A1 | 12/2019 | He et al. |
| 2019/0370575 A1 | 12/2019 | Nandakumar et al. |
| 2019/0370935 A1 | 12/2019 | Chang et al. |
| 2019/0373322 A1 | 12/2019 | Rojas-Echenique et al. |
| 2019/0377345 A1 | 12/2019 | Bachrach et al. |
| 2019/0377965 A1 | 12/2019 | Totolos et al. |
| 2019/0378049 A1 | 12/2019 | Widmann et al. |
| 2019/0378051 A1 | 12/2019 | Widmann et al. |
| 2019/0382007 A1 | 12/2019 | Casas et al. |
| 2019/0384303 A1 | 12/2019 | Muller et al. |
| 2019/0384304 A1 | 12/2019 | Towal et al. |
| 2019/0384309 A1 | 12/2019 | Silva et al. |
| 2019/0384994 A1 | 12/2019 | Frossard et al. |
| 2019/0385048 A1 | 12/2019 | Cassidy et al. |
| 2019/0385360 A1 | 12/2019 | Yang et al. |
| 2020/0004259 A1 | 1/2020 | Gulino et al. |
| 2020/0004351 A1 | 1/2020 | Marchant et al. |
| 2020/0012936 A1 | 1/2020 | Lee et al. |
| 2020/0017117 A1 | 1/2020 | Milton |
| 2020/0025931 A1 | 1/2020 | Liang et al. |
| 2020/0026282 A1 | 1/2020 | Choe et al. |
| 2020/0026283 A1 | 1/2020 | Barnes et al. |
| 2020/0026992 A1 | 1/2020 | Zhang et al. |
| 2020/0027210 A1 | 1/2020 | Haemel et al. |
| 2020/0033858 A1 | 1/2020 | Xiao |
| 2020/0033865 A1 | 1/2020 | Mellinger et al. |
| 2020/0034665 A1 | 1/2020 | Ghanta et al. |
| 2020/0034710 A1 | 1/2020 | Sidhu et al. |
| 2020/0036948 A1 | 1/2020 | Song |
| 2020/0039520 A1 | 2/2020 | Misu et al. |
| 2020/0051550 A1 | 2/2020 | Baker |
| 2020/0060757 A1 | 2/2020 | Ben-Haim et al. |
| 2020/0065711 A1 | 2/2020 | Clément et al. |
| 2020/0065879 A1 | 2/2020 | Hu et al. |
| 2020/0069973 A1 | 3/2020 | Lou et al. |
| 2020/0073385 A1 | 3/2020 | Jobanputra et al. |
| 2020/0074230 A1 | 3/2020 | Englard et al. |
| 2020/0086880 A1 | 3/2020 | Poeppel et al. |
| 2020/0089243 A1 | 3/2020 | Poeppel et al. |
| 2020/0089969 A1 | 3/2020 | Lakshmi et al. |
| 2020/0090056 A1 | 3/2020 | Singhal et al. |
| 2020/0097841 A1 | 3/2020 | Petousis et al. |
| 2020/0098095 A1 | 3/2020 | Borcs et al. |
| 2020/0103894 A1 | 4/2020 | Cella et al. |
| 2020/0104705 A1 | 4/2020 | Bhowmick et al. |
| 2020/0110416 A1 | 4/2020 | Hong et al. |
| 2020/0117180 A1 | 4/2020 | Cella et al. |
| 2020/0117889 A1 | 4/2020 | Laput et al. |
| 2020/0117916 A1 | 4/2020 | Liu |
| 2020/0117917 A1 | 4/2020 | Yoo |
| 2020/0118035 A1 | 4/2020 | Asawa et al. |
| 2020/0125844 A1 | 4/2020 | She et al. |
| 2020/0125845 A1 | 4/2020 | Hess et al. |
| 2020/0126129 A1 | 4/2020 | Lkhamsuren et al. |
| 2020/0134427 A1 | 4/2020 | Oh et al. |
| 2020/0134461 A1 | 4/2020 | Chai et al. |
| 2020/0134466 A1 | 4/2020 | Weintraub et al. |
| 2020/0134848 A1 | 4/2020 | El-Khamy et al. |
| 2020/0143231 A1 | 5/2020 | Fusi et al. |
| 2020/0143279 A1 | 5/2020 | West et al. |
| 2020/0148201 A1 | 5/2020 | King et al. |
| 2020/0149898 A1 | 5/2020 | Felip et al. |
| 2020/0151201 A1 | 5/2020 | Chandrasekhar et al. |
| 2020/0151619 A1 | 5/2020 | Mopur et al. |
| 2020/0151692 A1 | 5/2020 | Gao et al. |
| 2020/0158822 A1 | 5/2020 | Owens et al. |
| 2020/0158869 A1 | 5/2020 | Amirloo et al. |
| 2020/0159225 A1 | 5/2020 | Zeng et al. |
| 2020/0160064 A1 | 5/2020 | Wang et al. |
| 2020/0160104 A1 | 5/2020 | Urtasun et al. |
| 2020/0160117 A1 | 5/2020 | Urtasun et al. |
| 2020/0160178 A1 | 5/2020 | Kar et al. |
| 2020/0160532 A1 | 5/2020 | Urtasun et al. |
| 2020/0160558 A1 | 5/2020 | Urtasun et al. |
| 2020/0160559 A1 | 5/2020 | Urtasun et al. |
| 2020/0160598 A1 | 5/2020 | Manivasagam et al. |

(56) References Cited

U.S. PATENT DOCUMENTS

| | | |
|---|---|---|
| 2020/0162489 A1 | 5/2020 | Bar-Nahum et al. |
| 2020/0167438 A1 | 5/2020 | Herring |
| 2020/0167554 A1 | 5/2020 | Wang et al. |
| 2020/0174481 A1 | 6/2020 | Van Heukelom et al. |
| 2020/0175326 A1 | 6/2020 | Shen et al. |
| 2020/0175354 A1 | 6/2020 | Volodarskiy et al. |
| 2020/0175371 A1 | 6/2020 | Kursun |
| 2020/0175401 A1 | 6/2020 | Shen |
| 2020/0183482 A1 | 6/2020 | Sebot et al. |
| 2020/0184250 A1 | 6/2020 | Oko |
| 2020/0184333 A1 | 6/2020 | Oh |
| 2020/0192389 A1 | 6/2020 | ReMine et al. |
| 2020/0193313 A1 | 6/2020 | Ghanta et al. |
| 2020/0193328 A1 | 6/2020 | Guestrin et al. |
| 2020/0202136 A1 | 6/2020 | Shrestha et al. |
| 2020/0202196 A1 | 6/2020 | Guo et al. |
| 2020/0209857 A1 | 7/2020 | Djuric et al. |
| 2020/0209867 A1 | 7/2020 | Valois et al. |
| 2020/0209874 A1 | 7/2020 | Chen et al. |
| 2020/0210717 A1 | 7/2020 | Hou et al. |
| 2020/0210769 A1 | 7/2020 | Hou et al. |
| 2020/0210777 A1 | 7/2020 | Valois et al. |
| 2020/0216064 A1 | 7/2020 | du Toit et al. |
| 2020/0218722 A1 | 7/2020 | Mai et al. |
| 2020/0218979 A1 | 7/2020 | Kwon et al. |
| 2020/0223434 A1 | 7/2020 | Campos et al. |
| 2020/0225758 A1 | 7/2020 | Tang et al. |
| 2020/0226377 A1 | 7/2020 | Campos et al. |
| 2020/0226430 A1 | 7/2020 | Ahuja et al. |
| 2020/0238998 A1 | 7/2020 | Dasalukunte et al. |
| 2020/0242381 A1 | 7/2020 | Chao et al. |
| 2020/0242408 A1 | 7/2020 | Kim et al. |
| 2020/0242511 A1 | 7/2020 | Kale et al. |
| 2020/0245869 A1 | 8/2020 | Sivan et al. |
| 2020/0249685 A1 | 8/2020 | Elluswamy et al. |
| 2020/0250456 A1 | 8/2020 | Wang et al. |
| 2020/0250515 A1 | 8/2020 | Rifkin et al. |
| 2020/0250874 A1 | 8/2020 | Assouline et al. |
| 2020/0257301 A1 | 8/2020 | Weiser et al. |
| 2020/0257306 A1 | 8/2020 | Nisenzon |
| 2020/0258057 A1 | 8/2020 | Farahat et al. |
| 2020/0265247 A1 | 8/2020 | Musk et al. |
| 2020/0272160 A1 | 8/2020 | Djuric et al. |
| 2020/0272162 A1 | 8/2020 | Hasselgren et al. |
| 2020/0272859 A1 | 8/2020 | Iashyn et al. |
| 2020/0273231 A1 | 8/2020 | Schied et al. |
| 2020/0279354 A1 | 9/2020 | Klaiman |
| 2020/0279364 A1 | 9/2020 | Sarkisian et al. |
| 2020/0279371 A1 | 9/2020 | Wenzel et al. |
| 2020/0285464 A1 | 9/2020 | Brebner |
| 2020/0286256 A1 | 9/2020 | Houts et al. |
| 2020/0293786 A1 | 9/2020 | Jia et al. |
| 2020/0293796 A1 | 9/2020 | Sajjadi et al. |
| 2020/0293828 A1 | 9/2020 | Wang et al. |
| 2020/0293905 A1 | 9/2020 | Huang et al. |
| 2020/0294162 A1 | 9/2020 | Shah |
| 2020/0294257 A1 | 9/2020 | Yoo et al. |
| 2020/0294310 A1 | 9/2020 | Lee et al. |
| 2020/0297237 A1 | 9/2020 | Tamersoy et al. |
| 2020/0298891 A1 | 9/2020 | Liang et al. |
| 2020/0301799 A1 | 9/2020 | Manlvasagam et al. |
| 2020/0302276 A1 | 9/2020 | Yang et al. |
| 2020/0302291 A1 | 9/2020 | Hong |
| 2020/0302627 A1 | 9/2020 | Duggal et al. |
| 2020/0302662 A1 | 9/2020 | Homayounfar et al. |
| 2020/0304441 A1 | 9/2020 | Bradley et al. |
| 2020/0306640 A1 | 10/2020 | Kolen et al. |
| 2020/0307562 A1 | 10/2020 | Ghafarianzadeh et al. |
| 2020/0307563 A1 | 10/2020 | Ghafarianzadeh et al. |
| 2020/0309536 A1 | 10/2020 | Omari et al. |
| 2020/0309923 A1 | 10/2020 | Bhaskaran et al. |
| 2020/0310442 A1 | 10/2020 | Halder et al. |
| 2020/0311601 A1 | 10/2020 | Robinson et al. |
| 2020/0312003 A1 | 10/2020 | Borovikov et al. |
| 2020/0315708 A1 | 10/2020 | Mosnier et al. |
| 2020/0320132 A1 | 10/2020 | Neumann |
| 2020/0324073 A1 | 10/2020 | Rajan et al. |
| 2020/0327192 A1 | 10/2020 | Hackman et al. |
| 2020/0327443 A1 | 10/2020 | Van et al. |
| 2020/0327449 A1 | 10/2020 | Tiwari et al. |
| 2020/0327662 A1 | 10/2020 | Liu et al. |
| 2020/0327667 A1 | 10/2020 | Arbel et al. |
| 2020/0331476 A1 | 10/2020 | Chen et al. |
| 2020/0334416 A1 | 10/2020 | Vianu et al. |
| 2020/0334495 A1 | 10/2020 | Al et al. |
| 2020/0334501 A1 | 10/2020 | Lin et al. |
| 2020/0334551 A1 | 10/2020 | Javidi et al. |
| 2020/0334574 A1 | 10/2020 | Ishida |
| 2020/0337648 A1 | 10/2020 | Saripalli et al. |
| 2020/0341466 A1 | 10/2020 | Pham et al. |
| 2020/0342350 A1 | 10/2020 | Madar et al. |
| 2020/0342548 A1 | 10/2020 | Mazed et al. |
| 2020/0342652 A1 | 10/2020 | Rowell et al. |
| 2020/0348909 A1 | 11/2020 | Das Sarma et al. |
| 2020/0350063 A1 | 11/2020 | Thornton et al. |
| 2020/0351438 A1 | 11/2020 | Dewhurst et al. |
| 2020/0356107 A1 | 11/2020 | Wells |
| 2020/0356790 A1 | 11/2020 | Jaipuria et al. |
| 2020/0356864 A1 | 11/2020 | Neumann |
| 2020/0356905 A1 | 11/2020 | Luk et al. |
| 2020/0361083 A1 | 11/2020 | Mousavian et al. |
| 2020/0361485 A1 | 11/2020 | Zhu et al. |
| 2020/0364481 A1 | 11/2020 | Kornienko et al. |
| 2020/0364508 A1 | 11/2020 | Gurel et al. |
| 2020/0364540 A1 | 11/2020 | Elsayed et al. |
| 2020/0364746 A1 | 11/2020 | Longano et al. |
| 2020/0364953 A1 | 11/2020 | Simoudis |
| 2020/0372362 A1 | 11/2020 | Kim |
| 2020/0372402 A1 | 11/2020 | Kursun et al. |
| 2020/0380362 A1 | 12/2020 | Cao et al. |
| 2020/0380383 A1 | 12/2020 | Kwong et al. |
| 2020/0393841 A1 | 12/2020 | Frisbie et al. |
| 2020/0394421 A1 | 12/2020 | Yu et al. |
| 2020/0394457 A1 | 12/2020 | Brady |
| 2020/0394495 A1 | 12/2020 | Moudgill et al. |
| 2020/0394813 A1 | 12/2020 | Theverapperuma et al. |
| 2020/0396394 A1 | 12/2020 | Zlokolica et al. |
| 2020/0398855 A1 | 12/2020 | Thompson |
| 2020/0401850 A1 | 12/2020 | Bazarsky et al. |
| 2020/0401886 A1 | 12/2020 | Deng et al. |
| 2020/0402155 A1 | 12/2020 | Kurian et al. |
| 2020/0402226 A1 | 12/2020 | Peng |
| 2020/0410012 A1 | 12/2020 | Moon et al. |
| 2020/0410224 A1 | 12/2020 | Goel |
| 2020/0410254 A1 | 12/2020 | Pham et al. |
| 2020/0410288 A1 | 12/2020 | Capota et al. |
| 2020/0410751 A1 | 12/2020 | Omari et al. |
| 2021/0004014 A1 | 1/2021 | Sivakumar |
| 2021/0004580 A1 | 1/2021 | Sundararaman et al. |
| 2021/0004611 A1 | 1/2021 | Garimella et al. |
| 2021/0004663 A1 | 1/2021 | Park et al. |
| 2021/0006835 A1 | 1/2021 | Slattery et al. |
| 2021/0011908 A1 | 1/2021 | Hayes et al. |
| 2021/0012116 A1 | 1/2021 | Urtasun et al. |
| 2021/0012210 A1 | 1/2021 | Sikka et al. |
| 2021/0012230 A1 | 1/2021 | Hayes et al. |
| 2021/0012239 A1 | 1/2021 | Arzani et al. |
| 2021/0015240 A1 | 1/2021 | Elfakhri et al. |
| 2021/0019215 A1 | 1/2021 | Neeter |
| 2021/0026360 A1 | 1/2021 | Luo |
| 2021/0027112 A1 | 1/2021 | Brewington et al. |
| 2021/0027117 A1 | 1/2021 | McGavran et al. |
| 2021/0030276 A1 | 2/2021 | Li et al. |
| 2021/0034921 A1 | 2/2021 | Pinkovich et al. |
| 2021/0042575 A1 | 2/2021 | Firner |
| 2021/0042928 A1 | 2/2021 | Takeda et al. |
| 2021/0046954 A1 | 2/2021 | Haynes |
| 2021/0049378 A1 | 2/2021 | Gautam et al. |
| 2021/0049455 A1 | 2/2021 | Kursun |
| 2021/0049456 A1 | 2/2021 | Kursun |
| 2021/0049548 A1 | 2/2021 | Grisz et al. |
| 2021/0049700 A1 | 2/2021 | Nguyen et al. |
| 2021/0056114 A1 | 2/2021 | Price et al. |
| 2021/0056306 A1 | 2/2021 | Hu et al. |

(56) References Cited

U.S. PATENT DOCUMENTS

| | | |
|---|---|---|
| 2021/0056317 A1 | 2/2021 | Golov |
| 2021/0056420 A1 | 2/2021 | Konishi et al. |
| 2021/0056701 A1 | 2/2021 | Vranceanu et al. |

FOREIGN PATENT DOCUMENTS

| | | |
|---|---|---|
| CN | 110599537 A | 12/2010 |
| CN | 102737236 A | 10/2012 |
| CN | 103366339 A | 10/2013 |
| CN | 104835114 A | 8/2015 |
| CN | 103236037 B | 5/2016 |
| CN | 103500322 B | 8/2016 |
| CN | 106419893 A | 2/2017 |
| CN | 106504253 A | 3/2017 |
| CN | 107031600 A | 8/2017 |
| CN | 107169421 A | 9/2017 |
| CN | 107507134 A | 12/2017 |
| CN | 107885214 A | 4/2018 |
| CN | 108122234 A | 6/2018 |
| CN | 107133943 B | 7/2018 |
| CN | 107368926 B | 7/2018 |
| CN | 105318888 B | 8/2018 |
| CN | 108491889 A | 9/2018 |
| CN | 108647591 A | 10/2018 |
| CN | 108710865 A | 10/2018 |
| CN | 105550701 B | 11/2018 |
| CN | 108764185 A | 11/2018 |
| CN | 108845574 A | 11/2018 |
| CN | 108898177 A | 11/2018 |
| CN | 109086867 A | 12/2018 |
| CN | 107103113 B | 1/2019 |
| CN | 109215067 A | 1/2019 |
| CN | 109359731 A | 2/2019 |
| CN | 109389207 A | 2/2019 |
| CN | 109389552 A | 2/2019 |
| CN | 106779060 B | 3/2019 |
| CN | 109579856 A | 4/2019 |
| CN | 109615073 A | 4/2019 |
| CN | 106156754 B | 5/2019 |
| CN | 106598226 B | 5/2019 |
| CN | 106650922 B | 5/2019 |
| CN | 109791626 A | 5/2019 |
| CN | 109901595 A | 6/2019 |
| CN | 109902732 A | 6/2019 |
| CN | 109934163 A | 6/2019 |
| CN | 109948428 A | 6/2019 |
| CN | 109949257 A | 6/2019 |
| CN | 109951710 A | 6/2019 |
| CN | 109975308 A | 7/2019 |
| CN | 109978132 A | 7/2019 |
| CN | 109978161 A | 7/2019 |
| CN | 110060202 A | 7/2019 |
| CN | 110069071 A | 7/2019 |
| CN | 110084086 A | 8/2019 |
| CN | 110096937 A | 8/2019 |
| CN | 110111340 A | 8/2019 |
| CN | 110135485 A | 8/2019 |
| CN | 110197270 B | 9/2019 |
| CN | 110310264 A | 10/2019 |
| CN | 110321965 A | 10/2019 |
| CN | 110334801 A | 10/2019 |
| CN | 110399875 A | 11/2019 |
| CN | 110414362 A | 11/2019 |
| CN | 110426051 A | 11/2019 |
| CN | 110473173 A | 11/2019 |
| CN | 110516665 A | 11/2019 |
| CN | 110543837 A | 12/2019 |
| CN | 110569899 A | 12/2019 |
| CN | 110599864 A | 12/2019 |
| CN | 110619282 A | 12/2019 |
| CN | 110619283 A | 12/2019 |
| CN | 110619330 A | 12/2019 |
| CN | 110659628 A | 1/2020 |
| CN | 110688992 A | 1/2020 |
| CN | 107742311 B | 2/2020 |
| CN | 110751280 A | 2/2020 |
| CN | 110826566 A | 2/2020 |
| CN | 111047225 A | 2/2020 |
| CN | 107451659 B | 4/2020 |
| CN | 108111873 B | 4/2020 |
| CN | 110956185 A | 4/2020 |
| CN | 110966991 A | 4/2020 |
| CN | 111027549 A | 4/2020 |
| CN | 111027575 A | 4/2020 |
| CN | 111126453 A | 5/2020 |
| CN | 111158355 A | 5/2020 |
| CN | 107729998 B | 6/2020 |
| CN | 108549934 B | 6/2020 |
| CN | 111275129 A | 6/2020 |
| CN | 111275618 A | 6/2020 |
| CN | 111326023 A | 6/2020 |
| CN | 111428943 A | 7/2020 |
| CN | 111444821 A | 7/2020 |
| CN | 111445420 A | 7/2020 |
| CN | 111461052 A | 7/2020 |
| CN | 111461053 A | 7/2020 |
| CN | 111461110 A | 7/2020 |
| CN | 110225341 B | 8/2020 |
| CN | 111307162 B | 8/2020 |
| CN | 111488770 A | 8/2020 |
| CN | 111539514 A | 8/2020 |
| CN | 111565318 A | 8/2020 |
| CN | 111582216 A | 8/2020 |
| CN | 111598095 A | 8/2020 |
| CN | 108229526 B | 9/2020 |
| CN | 111693972 A | 9/2020 |
| CN | 106558058 B | 10/2020 |
| CN | 107169560 B | 10/2020 |
| CN | 107622258 B | 10/2020 |
| CN | 111767801 A | 10/2020 |
| CN | 111768002 A | 10/2020 |
| CN | 111783545 A | 10/2020 |
| CN | 111783971 A | 10/2020 |
| CN | 111797657 A | 10/2020 |
| CN | 111814623 A | 10/2020 |
| CN | 111814902 A | 10/2020 |
| CN | 111860499 A | 10/2020 |
| CN | 111881856 A | 11/2020 |
| CN | 111882579 A | 11/2020 |
| CN | 111897639 A | 11/2020 |
| CN | 111898507 A | 11/2020 |
| CN | 111898523 A | 11/2020 |
| CN | 111899227 A | 11/2020 |
| CN | 112101175 A | 12/2020 |
| CN | 112101562 A | 12/2020 |
| CN | 112115953 A | 12/2020 |
| CN | 111062973 B | 1/2021 |
| CN | 111275080 B | 1/2021 |
| CN | 112183739 A | 1/2021 |
| CN | 112232497 A | 1/2021 |
| CN | 112288658 A | 1/2021 |
| CN | 112308095 A | 2/2021 |
| CN | 112308799 A | 2/2021 |
| CN | 112313663 A | 2/2021 |
| CN | 112329552 A | 2/2021 |
| CN | 112348783 A | 2/2021 |
| CN | 111899245 B | 3/2021 |
| DE | 202017102235 U1 | 5/2017 |
| DE | 202017102238 U1 | 5/2017 |
| DE | 102017116017 A1 | 1/2019 |
| DE | 102018130821 A1 | 6/2020 |
| DE | 102019008316 A1 | 8/2020 |
| EP | 1215626 B1 | 9/2008 |
| EP | 2228666 B1 | 9/2012 |
| EP | 2420408 B1 | 5/2013 |
| EP | 2723069 A1 | 4/2014 |
| EP | 2741253 A1 | 6/2014 |
| EP | 3115772 A1 | 1/2017 |
| EP | 2618559 B1 | 8/2017 |
| EP | 3285485 A1 | 2/2018 |
| EP | 2863633 B1 | 2/2019 |
| EP | 3113080 B1 | 5/2019 |
| EP | 3525132 A1 | 8/2019 |
| EP | 3531689 A1 | 8/2019 |

(56) References Cited

FOREIGN PATENT DOCUMENTS

| | | |
|---|---|---|
| EP | 3537340 A1 | 9/2019 |
| EP | 3543917 A1 | 9/2019 |
| EP | 3608840 A1 | 2/2020 |
| EP | 3657387 A1 | 5/2020 |
| EP | 2396750 B1 | 6/2020 |
| EP | 3664020 A1 | 6/2020 |
| EP | 3690712 A1 | 8/2020 |
| EP | 3690742 A1 | 8/2020 |
| EP | 3722992 A1 | 10/2020 |
| EP | 3690730 A2 | 11/2020 |
| EP | 3739486 A1 | 11/2020 |
| EP | 3501897 B1 | 12/2020 |
| EP | 3751455 A2 | 12/2020 |
| EP | 3783527 A1 | 2/2021 |
| GB | 2402572 B | 8/2005 |
| GB | 2548087 A | 9/2017 |
| GB | 2577485 A | 4/2020 |
| GB | 2517270 B | 6/2020 |
| JP | 3941252 B2 | 7/2007 |
| JP | 4282583 B2 | 6/2009 |
| JP | 4300098 B2 | 7/2009 |
| JP | 2015004922 A | 1/2015 |
| JP | 5863536 B2 | 2/2016 |
| JP | 6044134 B2 | 12/2016 |
| JP | 6525707 B2 | 6/2019 |
| JP | 2019101535 A | 6/2019 |
| JP | 2020101927 A | 7/2020 |
| JP | 2020173744 A | 10/2020 |
| KR | 100326702 B1 | 2/2002 |
| KR | 101082878 B1 | 11/2011 |
| KR | 101738422 B1 | 5/2017 |
| KR | 101969864 B1 | 4/2019 |
| KR | 101996167 B1 | 7/2019 |
| KR | 102022388 B1 | 8/2019 |
| KR | 102043143 B1 | 11/2019 |
| KR | 102095335 B1 | 3/2020 |
| KR | 102097120 B1 | 4/2020 |
| KR | 1020200085490 A | 7/2020 |
| KR | 102189262 B1 | 12/2020 |
| KR | 1020200142266 A | 12/2020 |
| TW | 200630819 A | 9/2006 |
| TW | I294089 B | 3/2008 |
| TW | I306207 B | 2/2009 |
| WO | WO 02/052835 | 7/2002 |
| WO | WO 16/032398 | 3/2016 |
| WO | WO 16/048108 | 3/2016 |
| WO | WO 16/207875 | 12/2016 |
| WO | WO 17/158622 | 9/2017 |
| WO | WO 19/005547 | 1/2019 |
| WO | WO 19/067695 | 4/2019 |
| WO | WO 19/089339 | 5/2019 |
| WO | WO 19/092456 | 5/2019 |
| WO | WO 19/099622 | 5/2019 |
| WO | WO 19/122952 | 6/2019 |
| WO | WO 19/125191 | 6/2019 |
| WO | WO 19/126755 | 6/2019 |
| WO | WO 19/144575 | 8/2019 |
| WO | WO 19/182782 | 9/2019 |
| WO | WO 19/191578 | 10/2019 |
| WO | WO 19/216938 | 11/2019 |
| WO | WO 19/220436 | 11/2019 |
| WO | WO 20/006154 | 1/2020 |
| WO | WO 20/012756 | 1/2020 |
| WO | WO 20/025696 | 2/2020 |
| WO | WO 20/034663 | 2/2020 |
| WO | WO 20/056157 | 3/2020 |
| WO | WO 20/076356 | 4/2020 |
| WO | WO 20/097221 | 5/2020 |
| WO | WO 20/101246 | 5/2020 |
| WO | WO 20/120050 | 6/2020 |
| WO | WO 20/121973 | 6/2020 |
| WO | WO 20/131140 | 6/2020 |
| WO | WO 20/139181 | 7/2020 |
| WO | WO 20/139355 | 7/2020 |
| WO | WO 20/139357 | 7/2020 |
| WO | WO 20/142193 | 7/2020 |
| WO | WO 20/146445 | 7/2020 |
| WO | WO 20/151329 | 7/2020 |
| WO | WO 20/157761 | 8/2020 |
| WO | WO 20/163455 | 8/2020 |
| WO | WO 20/167667 | 8/2020 |
| WO | WO 20/174262 | 9/2020 |
| WO | WO 20/177583 | 9/2020 |
| WO | WO 20/185233 | 9/2020 |
| WO | WO 20/185234 | 9/2020 |
| WO | WO 20/195658 | 10/2020 |
| WO | WO 20/198189 | 10/2020 |
| WO | WO 20/198779 | 10/2020 |
| WO | WO 20/205597 | 10/2020 |
| WO | WO 20/221200 | 11/2020 |
| WO | WO 20/240284 | 12/2020 |
| WO | WO 20/260020 | 12/2020 |
| WO | WO 20/264010 | 12/2020 |

\* cited by examiner

DATA SYNTHESIS FOR AUTONOMOUS CONTROL SYSTEMS

CROSS-REFERENCE TO RELATED APPLICATIONS

This application is a continuation of, and claims priority to, U.S. patent application Ser. No. 15/934,899 entitled 'DATA SYNTHESIS FOR AUTONOMOUS CONTROL SYSTEMS' and filed on Mar. 23, 2018. U.S. patent application Ser. No. 15/934,899 claims the benefit of provisional U.S. Application No. 62/475,792, filed on Mar. 23, 2017, The above recited applications are hereby incorporated herein by reference in their entirety.

BACKGROUND

This invention relates generally to autonomous control systems for vehicles, and more particularly to autonomous control systems for vehicles using sensors.

Autonomous control systems are systems that guide vehicles (e.g., automobiles, trucks, vans) without direct guidance by human operators. Autonomous control systems analyze the surrounding physical environment in various ways to guide vehicles in a safe manner. For example, an autonomous control system may detect and/or track objects in the physical environment, and responsive to a detected object, guide the vehicle away from the object such that collision with the object can be avoided. As another example, an autonomous control system may detect boundaries of lanes on the road such that the vehicle can be guided within the appropriate lane with the flow of traffic.

Often times, autonomous control systems use computer models to perform algorithms for analyzing the surrounding environment and performing detection and control operations. The computer models are trained from data sets containing information that resemble potential environments the autonomous control system would encounter during operation. For example, a computer model for detecting pedestrians on the street may learn different representations of people from a data set containing various images of pedestrians. Typically, the performance of computer models improves with the amount of data available for learning. However, gathering data for training computer models is often costly and time-consuming.

SUMMARY

A system for autonomous vehicle control generates synthetic data for autonomous control systems that reflect simulated environments. Specifically, the synthetic data is a representation of sensor data of the simulated environment from the perspective of one or more sensors of the autonomous control systems. Sensor data of a sensor denotes the readings of the environment collected by the sensor that characterize how the sensor perceives the environment. For example, the representation of sensor data may be a two-dimensional "image" for an image sensor, such as a camera, a three-dimensional point cloud for a LIDAR sensor, The system generates synthetic data by introducing one or more simulated modifications to sensor data captured by the sensors or by simulating the sensor data for a virtual environment. The sensors can be passive sensors that include a receiver that detects and measures various forms of energy that are naturally emitted from the physical environment, or active sensors that emit energy and then measure the energy that is reflected back to one or more receivers in the sensor. For example, light detection and ranging (LIDAR) sensor signals attenuate when absorbed by precipitation. An example synthetic sensor data is a LIDAR sensor image that simulates precipitation in an environment by attenuating reflectance signals from a LIDAR sensor image of the environment on a clear day to account for the precipitation.

The autonomous control systems use the synthetic data to train computer models for various detection and control algorithms. In general, this allows autonomous control systems to augment training data to improve performance of computer models, simulate scenarios that are not included in existing training data, and/or train computer models that remove unwanted effects or occlusions from sensor data of the environment. For example, a computer model that mitigates the effect of precipitation on LIDAR sensor image data may be supplemented by synthetic images that simulate precipitation to those on a clear day. During precipitation, the autonomous control system may perform more robust detection and control algorithms on sensor data generated by the computer model.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
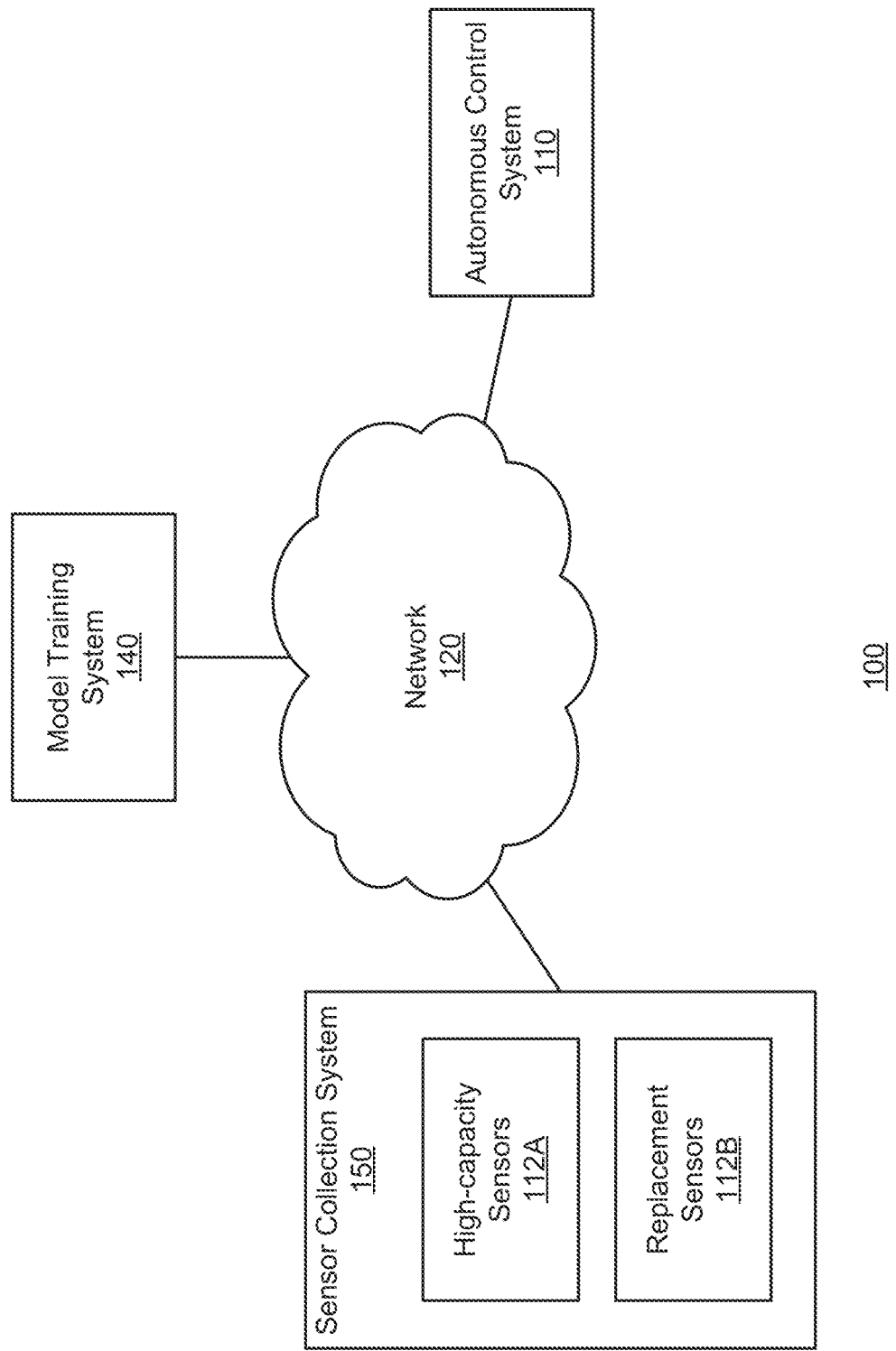
FIG. 1 is an example network environment for autonomous control, in accordance with an embodiment.

FIG. 1 is an example network environment 100 for autonomous control, in accordance with an embodiment. The network environment 100 includes an autonomous control system 110, a sensor collection system 150, and a data synthesizing module 140 coupled to a network 120.

The autonomous control system 110 guides vehicles based on information related to the surrounding environment received from the one or more sensors attached to the vehicles. The vehicles are any means of conveyance or transport in or by which someone or something can travel from one place to another, and may include automobiles, trucks, vans, robotic transports, and the like. The autonomous control system 110 may guide a vehicle through one or more trips from one destination to another. For example, the autonomous control system 110 may guide a ride-sharing vehicle (e.g., a taxi) from a passenger's point of pick-up to their desired destination. Though described herein as an autonomous vehicle, the control decisions of the autonomous controls system may provide semi-autonomous control rather than complete control of the vehicle, for example to supplement or override user control, or as primary means of control that can be overridden by a user. In addition, although the autonomous control system 110 is described herein as a system that guides vehicles, the autonomous control system 110 may also guide other systems such as robotic arms or manufacturing equipment.

One or more sensors are attached to the vehicles to gather information used to generate the control of the vehicle. The sensors are devices that detect information related to the physical environment. The information can be captured through many forms. For example, the sensors may be imaging sensors that capture scenes of the physical environment through a series of one or more images. In such an example, other vehicles proximate to the vehicle of the autonomous control system, stationary objects such as trees, fire hydrants, lamp posts, and the like may be captured in the images. As another example, the sensors may be geo-locational sensors, and more specifically global positioning system (GPS) sensors that detect the position of the sensor (and its attached vehicle) relative to a map of the physical environment. As yet another example, the sensors may be microphones that detect sounds in the environment in the form of audio signals. As defined herein, sensor data of a sensor denotes the readings of the environment collected by the sensor that characterize how the sensor perceives the environment.

The one or more sensors may include high-capacity sensors that have certain improved characteristics over other sensors. For example, high-capacity imaging sensors may generate sensor data having improved characteristics, such as increased resolution, data collection time, sharpness, field-of-view, and the like, compared to other sensors. As another example, high-capacity geo-locational sensors may pinpoint the location of the sensor more accurately than others. As another example, some high-capacity sensors are able to detect information at a level of accuracy or precision that other sensors cannot. For example, light detection and ranging (LIDAR) sensors can measure the distance from the sensor to an object at a level of accuracy that is difficult to achieve for image sensors. Alternatively, more-sophisticated LIDAR sensors may generate greater precision data than less-sophisticated LIDAR sensors. In general, high-capacity sensors tend to be complex, expensive, and bulky. Moreover, it may be difficult for an owner (or a manufacturer) of a vehicle to purchase and install high-capacity sensors separately on his or her vehicle.

On the other hand, due to their high capacity, only a few or even a single high-capacity sensor may be needed to collect a substantial amount of information on the physical environment for accurate performance of the autonomous control system 110. For example, a single LIDAR sensor on a vehicle can capture a 360-degree field-of-view of the physical environment through high-resolution signals that may be alone sufficient for accurate performance of the autonomous control system 110.

The one or more sensors may also include replacement sensors that have smaller capacity than high-capacity sensors, but may be more readily available than high-capacity sensors in that they are portable, easier to install, and relatively inexpensive. For example, many vehicles are now manufactured with sensors at the front and/or back of the car that provide real-time sensor data of the surroundings such that the operator can detect objects to avoid collisions with the object. However, these sensors have limited field-of-view that captures only a portion of the environment at the front and/or back of the vehicle. As another example, portable radio detection and ranging (RADAR) sensors may be able to detect distance of objects better than imaging sensors, but still may not have the accuracy of a high-capacity LIDAR sensor. As another example, portable cameras are easy to install on windshield or dashboard areas of the vehicle, but may lack the resolution and field-of-view of LIDAR sensors.

In contrast to high-capacity sensors, each sensor in a set of replacement sensors may provide fragments of information on the surrounding environment in different formats of sensor data and have lower precision information. However, the combination of sensor data may contain information comparable to that generated from high-capacity sensors. For example, a vehicle may have an RGB camera with a first resolution at the back of a vehicle, a greyscale camera with a second resolution at the dashboard of the vehicle, another RGB camera with a third resolution at the left and right sides of the vehicle, and a portable RADAR sensor. Individually, each camera has a fragmented field-of-view limited to one among the front, back, and sides of the vehicle in different resolutions and color, and the portable RADAR sensor has sub-optimal distance measurements (with respect to the high-capacity sensors). Through the analysis and modeling of these sensors discussed herein, the sensors together may contain information on objects and the physical environment that is comparable to a high-capacity LIDAR sensor by simulating the high-capacity sensor output with a learned sensor mapping from the sensors to the desired high-capacity sensor data.

The autonomous control system 110 performs various detection and control algorithms based on sensor data of the physical environment to guide the vehicles in a safe and efficient manner. For example, the autonomous control system 110 may detect various objects (e.g., lamp post, cars) that are proximate to a vehicle in the captured sensor data of the environment, and guide the vehicle away from the objects to prevent collision of the vehicle with the objects. As another example, the autonomous control system 110 may detect boundaries of lanes on the road such that the vehicle can be guided within the appropriate lane with the flow of traffic.

In one embodiment, the autonomous control system 110 may perform the detection and control algorithms on sensor data generated by high-capacity sensors. In general, the detection and control systems are relatively accurate when using high-capacity sensor data, since a substantial amount of information on the surrounding environment is contained through a single type of sensor data. However, as described above, many vehicles may lack high-capacity sensors due to their complexity and cost.

In one embodiment, the autonomous control system 110 may perform the detection and control algorithms on sensor data generated by replacement sensors having different capacity than high-capacity sensors that do not natively capture the precision or quality of sensor data available from the high-capacity sensor(s). Specifically, the autonomous control system 110 simulates high-capacity sensor data from sensor data generated by a set of replacement sensors. The autonomous control system 110 receives sensor data from replacement sensors that differ from the high-capacity sensors, and may have different characteristics from one another, attached at various positions of the vehicle, or capture different fields of view. The autonomous control system 110 synthesizes the combination of sensor data with a learned sensor mapping to simulate high-capacity sensor data as though the surrounding environment was characterized by high-capacity sensors. The autonomous control system 110 detects one or more objects based on the simulated high-capacity sensor data to control the vehicle for autonomous guidance.

In general, using simulated high-capacity sensor data for detection and control allows accurate guidance of the vehicle by using replacement sensors that may be relatively inexpensive and readily available compared to high-capacity sensors. In addition, the autonomous control system 110 can use existing control and detection systems that are configured for high-capacity sensor data. Returning to the example above, the autonomous control system 110 may synthesize the sensor data from the set of cameras with different resolution, color, and field-of-view (e.g., front, back, left, and right sides), and the portable RADAR sensor to simulate sensor data from a single LIDAR sensor having a large field-of-view and high resolution. The simulated data may be used as input to existing detection and control systems that use LIDAR sensor data.

In one embodiment, various functions of the autonomous control system 110 are performed through machine-learned computer models. In one embodiment, the machine-learned models are neural network models such as feed-forward networks, convolutional neural networks (CNN), deep neural networks (DNN), recurrent neural networks (RNN), self-organizing maps (SOM), and the like, that are trained by the model training system 140 based on training data sets.

The model training system 140 constructs machine-learned models based on sensor information provided by the sensor collection system 150. The trained machine-learned models perform various functions, such as simulating sensor data, estimating sensor quality, and other detection and control algorithms for use by the autonomous control system 110. The model training system 140 constructs the models based on training data sets. The training data sets contain information resembling potential environments the autonomous control system 110 would encounter during operation. For example, a computer model for detecting pedestrians on the street may learn different representations of people from a data set containing various images of pedestrians. A sufficient amount of training data generally leads to improved performance of computer models. However, gathering training data can be costly and time-consuming. Moreover, some characteristics of environments that are important for the computer models to learn may not be included in existing training data.

Thus, in one embodiment, the model training system 140 also synthesizes sensor data, and trains various computer models based on the synthesized sensor data. Specifically, the synthetic data represents sensor data of simulated scenarios in the environment from the perspective of one or more sensors included in the autonomous control system 110. For example, synthetic data may include sensor images of the environment that are modified to introduce artifacts in the environment. Specifically, artifacts introduced into the synthetic data may virtually represent any modifications to an environment in existing sensor data, and may represent atmospheric conditions such as precipitation, iciness, snow, lighting conditions such as intense sunlight, darkness, simulated objects such as pedestrians, precipitation, puddles, and the like in the surrounding environment. As another example, synthetic data may include sensor data of the environment that simulate partial sensor malfunction.

The model training system 140 may use the synthetic sensor data to augment existing training data and generally improve the accuracy of computer models. By training the computer models on augmented training data, the computer models can perform with improved accuracy when they are applied to sensor data from a physical sensor operating in an environment having the same type of artifacts that were included in the simulated data. For example, images of simulated pedestrians may be augmented to training data for training computer models that detect pedestrians. As another example, the model training system 140 may use synthetic data to train computer models for removing unwanted effects or occlusions from an environment to improve quality of sensor image data. LIDAR sensor signals are generally attenuated during precipitation, such as rain and fog, which may cause a reduction in performance of detection and control algorithms. To reduce the effect of precipitation during operation, the model training system 140 may train a machine-learned model that outputs sensor data mimicking the environment on a clear day given sensor data corresponding to the environment during precipitation. The model may be trained by supplementing synthetic sensor data that simulate precipitation with those on a clear day. This allows the model training system 140 to construct machine-learned models that perform robust detection and control since sensor readings generated during precipitation can be refined into a higher-quality version by the computer model to mitigate the effect of precipitation on the sensor data.

The model training system 140 trains the computer models using the set of synthesized sensor data to reduce differences between predictions generated based on the set of synthesized sensor data and a corresponding set of target outputs. Specifically, a computer model may be associated with a set of parameters, and the model training system 140 generates a set of predictions by applying the computer model with an estimated set of parameters to the set of synthesized sensor data. The model training system 140 determines a loss function that indicates a difference between the set of predictions and the set of target outputs. The set of parameters are updated to reduce the loss function.

Figure 2:
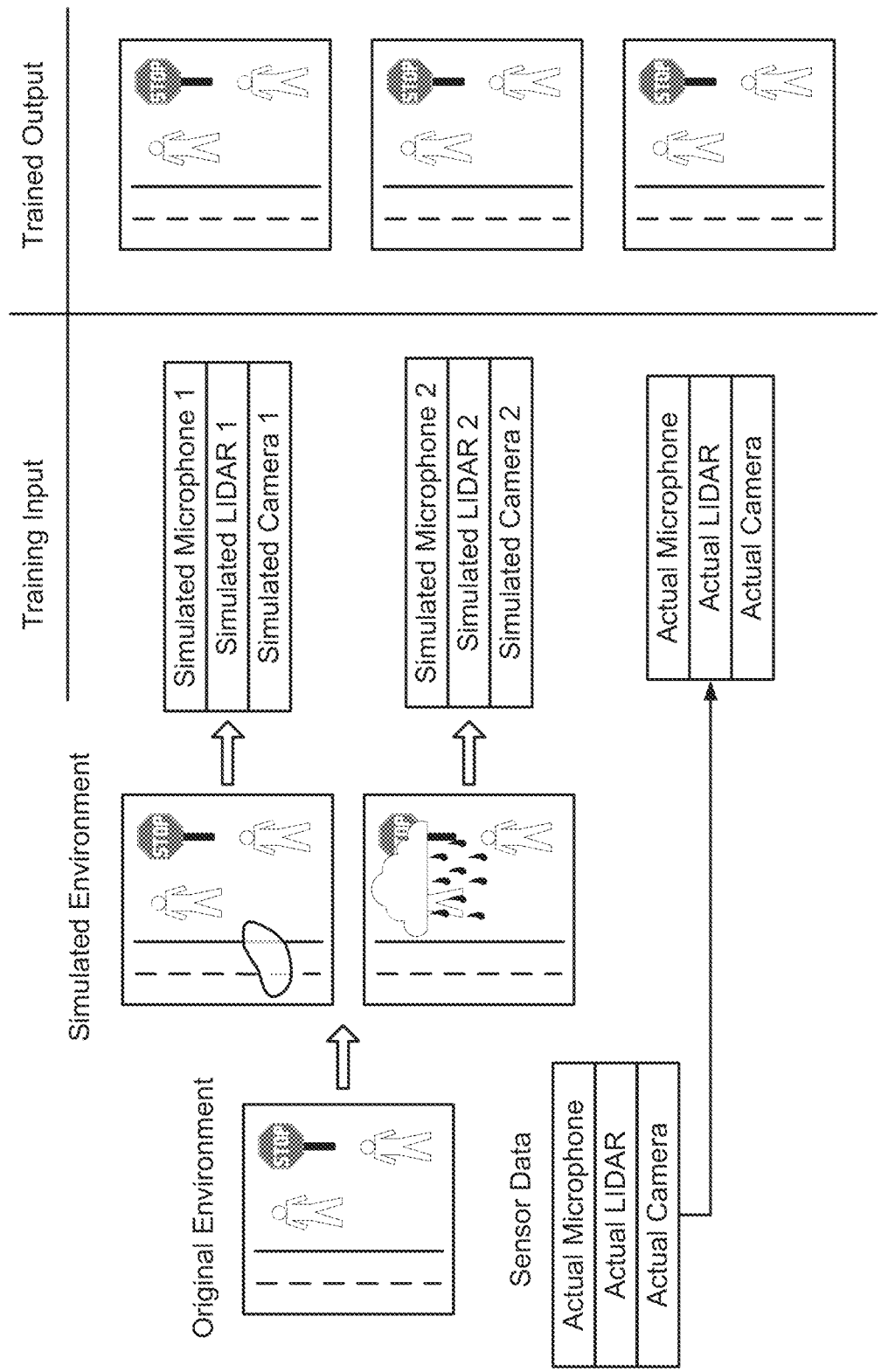
FIG. 2 illustrates an example process of introducing artifacts to original sensor data of the environment to generate synthetic images of simulated environments, and using the synthetic sensor data for training computer models.

FIG. 2 illustrates an example process of introducing artifacts to original sensor data of the environment to generate synthetic images of simulated environments, and using the synthetic sensor data for training computer models.

As shown in FIG. 2, the environment includes a road, two pedestrians, and a stop sign on the side of the road. A microphone, a LIDAR sensor, and a camera attached to a vehicle each generate a respective image of the environment. One example environment is simulated by the model training system 140, in which a puddle partially occluding lane markings on the road is introduced. Specifically, synthetic data of the example simulated environment for each of the sensors are generated, as shown by synthetic data "Simulated Microphone 1," "Simulated LIDAR 1," "Simulated Camera 1." Many other data pairs similar to the ones illustrated can be generated to construct training data. The model training system 140 constructs a computer model based on the pairs of original and synthetic training data that removes unwanted artifacts, such as the puddle, that occlude objects such as lane markings important for autonomous control.

Another example environment is simulated in which precipitation is introduced in the environment. Similarly, the model training system 150 generates synthetic sensor data of the example simulated environment for each of the sensors, shown by synthetic data "Simulated Microphone 2," "Simulated LIDAR 2," "Simulated Camera 2." The model training system 140 constructs a computer model based on the pairs of original and synthetic training data that mitigate the effect of precipitation on the sensor data such that robust detection and control can be performed even during bad weather conditions including precipitation.

Returning to the system 100 of FIG. 1, the sensor collection system 150 is attached to one or more data collection vehicles, and includes one or more sensors including high-capacity sensors 112A and replacement sensors 112B. The sensor collection system 150 collects training information related to the physical environment using both the high-capacity sensors 112A and the replacement sensors 112B, such that relationships can be learned between sensor data from the high-capacity sensors 112A and replacement sensors 112B.

The one or more sensors of the sensor collection system 150 can include active sensors and passive sensors. A passive sensor observes the environment. Passive sensors can include cameras, or microphones, vibration sensors, and the like. Passive sensors include a receiver that detects and measures various forms of energy that are naturally emitted from the physical environment or constituents of the physical environment across various locations of the environment. As an example, when the sensor is a camera, the sensor data is a time series of pixel data indicating intensities of detected light. That is, a time series of pictures is acquired. Each picture is divided into pixels and each pixel may have one or more intensity values associated with it depending on whether the camera is a greyscale camera or a color camera. For example, when the camera is a color camera describing a color of a pixel in red, green, and blue, the intensity value for each is typically an integer, such as an 8, 10, or 12-bit integer specifying the intensity of the red, green, or blue portion of the frequency. If the resolution of the picture were 100×100 pixels (having 10,000 total pixels), for every picture, there would be 3 separate channels of 10,000 pixels.

When the sensor is a microphone, the sensor data is a time series of air pressure values. In one embodiment, the time series of air pressure values is converted into a spectrogram. A spectrogram shows a time series of components (strengths) showing a collection of frequency strengths for each time period. The spectrogram is generated from the initial sound waves by a time windowed discrete Fourier transform, also sometimes called a "Gabor Transform." The size of the sensor data can be adjusted by adjusting the number of frequencies and/or the size of the time step, used in the windowed Fourier transform.

When the sensor is a vibration sensor, the sensor data is a time series of physical displacements of the vibration sensor in the system. The vibration sensor is typically attached or near to a particular component of the system to represent vibration of that component. Similarly to the microphone, in one embodiment, the time series of physical displacements are converted into a spectrogram, and the number of frequencies used in the Fourier transform can be adjusted.

The one or more sensors may include active sensors. Active sensors emit energy and then measure the energy that is reflected back to one or more receivers in the sensor. The reflected energy allows active sensors to probe for environmental information that may not otherwise be readily detected passively at the sensor. For example, active sensors may estimate distances of objects from the sensor better than passive sensors. Active sensors include both a transmitter and receiver of energy, in contrast to passive sensors that use receivers. Active sensors can include ultrasound sensors, RADAR sensors, active infrared (IR) sensors, LIDAR sensors, and the like. Usually, ultrasound sensors emit ultrasound waves, RADAR sensors emit microwaves, LIDAR sensors emit laser pulses in the near-IR or visible range waves, and IR sensors emit IR waves.

In one instance, the sensor data includes depth measurements that measures how far away an object is from the sensor. Specifically, the depth is measured by triggering a timer when the energy is emitted, and detecting the amount of time needed for the receiver to detect the reflected energy. The traveling speed of the energy can be used to calculate the depth of objects at various locations in the environment by emitting energy signals in the direction of the objects. In another instance, the sensor data also includes intensity measurements that measures the intensity of the reflected energy detected at the receiver of the sensor. These intensity values may be represented as 8 or 16-bit integer values.

For many types of active sensors, the sensor data is a collection of data points with reference to the sensor in a three-dimensional (3D) coordinate system ("point cloud" measurements) such as, for example, a spherical coordinate system or a Cartesian coordinate system. Each value designates the measurement of the actively-transmitted signal at the receiver (e.g., depth or reflected intensity). The number of data points in the point cloud is related to the resolution of the sensor. Further, even for a given sensor, the number of data points varies depending on factors such as what portion of the environment is within the sensor's range.

For example, when the sensor is a LIDAR sensor, the sensor data may include a point cloud of intensity measurements and a point cloud of reflectance measurements. Specifically, a narrow beam laser is pointed in a specific, known direction. This known direction can be identified as a pair of angles including a polar angle $\theta$ and an azimuth angle $\varphi$ with reference to the sensor. The polar angle $\theta$ specifies from the upward direction (0 degrees) to the downward direction (180 degrees), while the azimuth angle $\varphi$ specifies from the forward direction (0 degrees) to the backward direction (360 degrees).

By actively emitting energy across the entire field-of-view, a set of measurements for depth and/or intensity can be collected for different values of $(r, \theta, \varphi)$, where r denotes the depth measurement of an object (e.g., ground, cars, trees) to the sensor and $\theta$, $\varphi$ together denote the known direction object. Thus, a 3D view of the environment can be mapped to a point cloud representing objects in the environment by using the returned depth and intensity thereof.

In one embodiment, point cloud measurements are collected with rotational scanning. For example, multiple laser beams (e.g. 64 laser beams) can be emitted from a rotating drum, enabling multiple measurements across various values of $\theta$. In this case, $\theta$ and $\varphi$ are pre-determined by the position of the rotating drum and which of the multiple beams emitted the light, while r is measured based on the time-of-flight of the energy beam as discussed above.

In another embodiment, the point cloud measurements are collected by linear scanning in the (x,y) space. In such implementations, the light source is aimed at one or more mirrors. The mirrors, which may be microscopic mirrors (e.g. MEMS mirrors), can be manipulated programmatically, causing the energy beam to be steered. While mirror-based steering could potentially implement almost any scanning pattern, in practice these systems are usually used to implement grid-like scanning patterns that follow the Cartesian coordinate system.

In yet another embodiment, the point cloud measurements are collected through a phased array. A phased array is typically implemented with no moving parts. Instead, a phased array is made up of multiple transmitters at the same frequency but with different phase delay. A beam-like radiation pattern is achieved by the constructive and destructive interference of these multiple beams. The results of this approach can be viewed in polar coordinates or Cartesian coordinates.

Active sensors such as RADAR and LIDAR may output sparse representations of the environment. This sparsity can arise for a few reasons. For example, most active sensors have a minimum and maximum range at which they can reliably receive a returned signal. For example, a LIDAR sensor specifies a minimum usable return range of 0.9 meters and a maximum usable return range of 120 meters. When objects and the ground plane are outside of this range, no return is received, and therefore the returns comprise a sparse point cloud. As another example, even when objects are within range, occlusions such as rain or fog can lead to diffraction of a LIDAR sensor's laser beams. This can lead to fewer returns, which can cause the point cloud to be more sparse compared to the point clouds that are generated in dry weather.

In one particular embodiment, high-capacity sensors 112A refer to LIDAR sensors. The replacement sensors 112B can refer to sensors such as cameras, RADAR, lower-capacity LIDAR, and the like, that are each attached to various positions on the data collection vehicles, which may have smaller capacity than the high-capacity sensors in some aspect. The sensor collection system 150 provides collected training sensor data to the modeling system 130.

Figure 3:
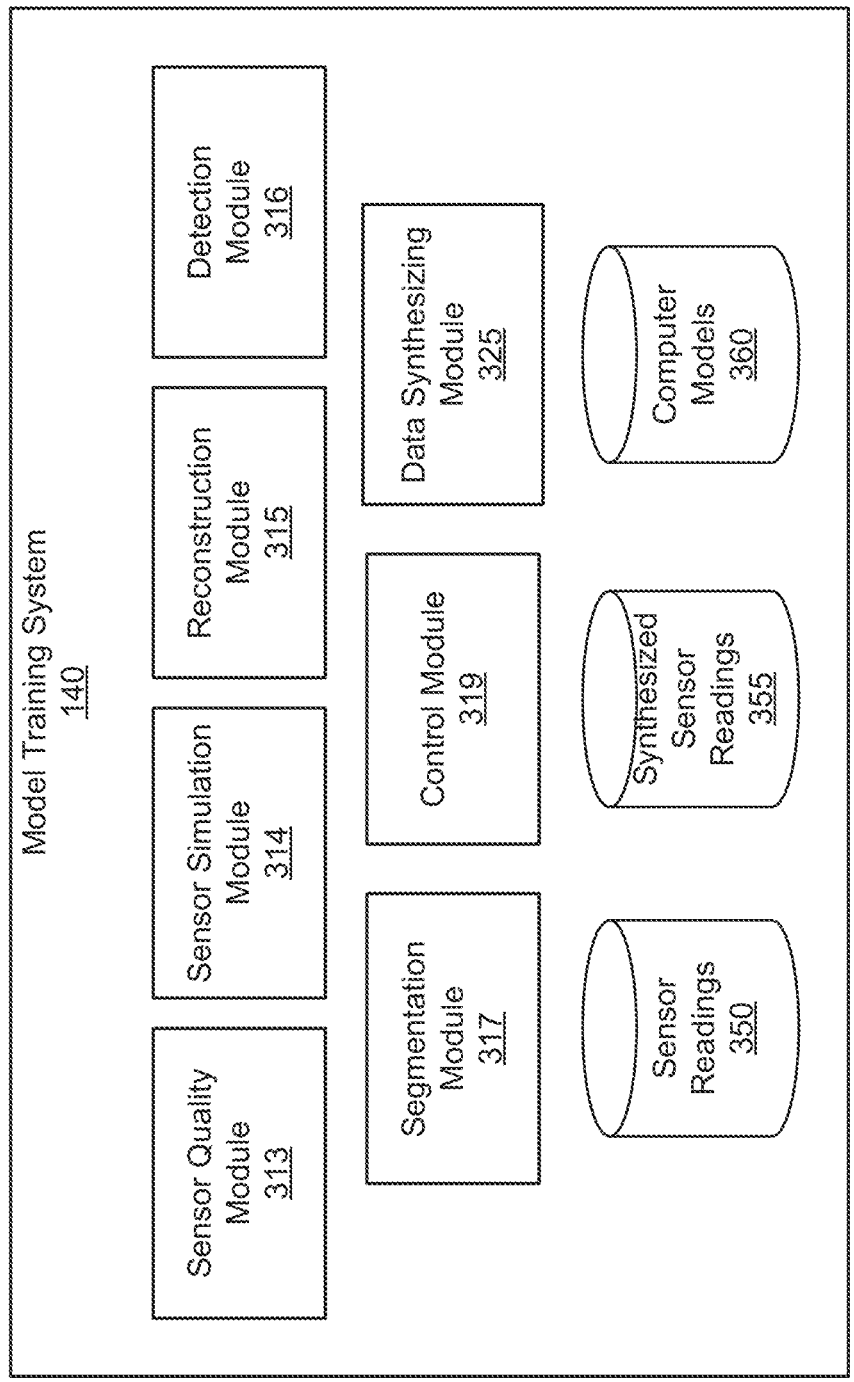
FIG. 3 is an example block diagram of an architecture of the model training system, in accordance with an embodiment.

FIG. 3 is an example block diagram of an architecture of the model training system 140, in accordance with an embodiment. The model training system 140 shown in FIG. 3 includes a sensor quality module 313, a sensor simulation module 314, a reconstruction module 315, a detection module 316, a segmentation module 317, a control module 319, and a data synthesizing module 323. The model training system 140 also includes a sensor reading database 350 and a synthesized sensor readings database 355.

The sensor reading database 350 contains sensor data from high-capacity sensors and replacement sensors from the sensor collection system 150 that can be used by modules of the model training system 140 to train machine-learned models.

The data synthesizing module 325 generates synthetic data that represent sensor data of simulated environments from the perspective of sensors of the autonomous control system 110. The data synthesizing module 325 may generate synthetic sensor data in response to one or more requests from modules of the model training system 140. Specifically, the data synthesizing module 325 generates synthetic data by applying modifications to sensor data, or by simulating the sensor data itself to capture how sensor signals will interact with the environment given conditions of the simulated environments depending on the request. The sensor signals are generated based on models that capture how sensors behave in practice. For example, a synthetic LIDAR image of the simulated environment including a virtual puddle that partially occludes lane markings on the road may be generated based on an original LIDAR image of the road, in which reflectance intensities of the LIDAR sensor signals are adjusted according to the change in reflectance caused by the puddle based on behavior models of LIDAR sensors. As another example, a simulated environment of a road during precipitation may be generated based on the original image of the road, in which reflectance intensities and the depth of sensor signals are attenuated depending on the degree of precipitation.

In one embodiment, the data synthesizing module 325 generates synthetic sensor data by representing the environment of a scene as a map, in which the ground plane, roads, and other landscape-related regions are identified in segments shaped, such as polygons. The environment may be represented in a set of sensor data that was captured by an actual sensor, or in a simulated virtual environment. The data synthesizing module 325 introduces objects and/or artifacts into the environment and may also animate different scenarios with the objects based on behavioral and physical models. For example, dangerous scenarios in which simulated pedestrians perform risky behavior, such as jaywalking, can be animated that are otherwise difficult to capture in the physical world. Based on the simulated scenes, the data synthesizing module 325 simulates sensor data that capture how different types of sensors would have perceived the environment if the scenes occurred in the physical world.

The sensor quality module 313 trains sensor quality models that receive sensor data and output information about the quality of data that the sensor(s) are producing. In one implementation, the sensor quality models produce a floating-point quality score in the range [0, 1] for each sensor input. If the sensor is unplugged or not installed, the quality score may be 0. If the sensor is operating with no degradation, the quality score may be 1. If the sensor is operating with degraded quality (e.g. the sensor's data acquisition ability is hampered by rain or by damaged hardware), then the quality score is a number between 0 and 1 that corresponds to the severity of the degradation. In another implementation, the sensor quality models output "no failure" if the sensor is working correctly, and it outputs the category of the problem if the sensor is not fully-functional. For example, the sensor quality models may output a category "rain" if it is raining, or "ice" if there is ice on the sensor, or "dark" if operating in low-light conditions, or "interference" if other active sensors are operating on the same wavelength, or "direct sunlight" if bright light is shining directly into the sensors. These outputs may be reported on both a per-sensor basis and/or a system-wide basis.

In one embodiment, the sensor quality module 313 trains one or more neural network models as the sensor quality models. Specifically, the sensor quality module 313 constructs a training data set that contains sensor data collected in a variety of weather and environmental conditions. Each instance of sensor data in the training data set is assigned a quality status label. For example, human annotators may assign a quality status label to each data sample, such as "rain," "dark," or "direct sunlight." The sensor quality models are trained to determine the quality status of sensor data based on the relationship between sensor data and status labels in the training data set.

Figure 4:
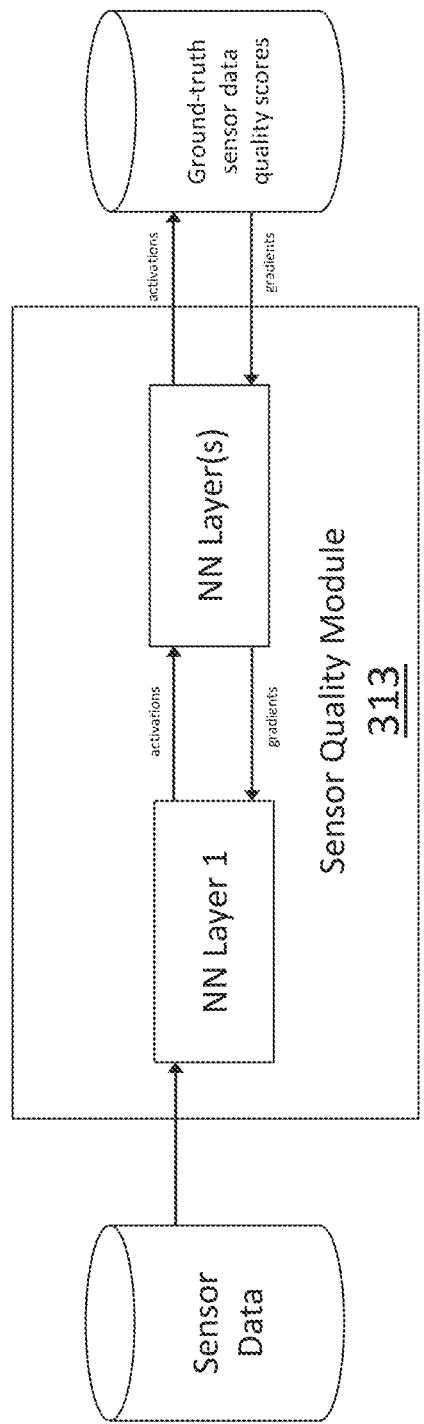
FIG. 4 illustrates an example process of training sensor quality models, in accordance with an embodiment.

FIG. 4 illustrates a process of training sensor quality models, in accordance with an embodiment. As shown in FIG. 4, the sensor quality module 313 constructs training data that contain instances of sensor data and a set of target outputs corresponding to known quality scores or labels of each instance. Based on the training data, the sensor quality module 313 trains one or more neural network layers that relate sensor data with sensor quality scores.

In one embodiment, the sensor quality module 313 requests synthesized training data form the data synthesizing module 140 that synthesizes sensor data corresponding to various quality scores for the sensors. For example, the sensor quality module 313 may request synthesized sensor data that synthesize effects such as "ice" or "rain." As another example, the sensor quality module 313 may request synthesized sensor data that simulate the sensor behavior in degraded conditions other than weather. In other embodiment, the training data for the data quality module 313 is obtained by simulation only.

The sensor simulation module 314 generates sensor simulation models that receive replacement sensor data and predict a high-capacity sensor data representation of the environment. In one embodiment, the sensor simulation module 314 trains one or more neural networks as the sensor simulation models to generate the simulated high-capacity sensor data. Specifically, the sensor simulation module 314 constructs a training data set that contains instances of replacement sensor data and corresponding instances of high-capacity sensor data such that the sensor simulation models can determine the relationship between data from a set of replacement sensors and data from high-capacity sensors. These can be obtained from the sensor collection system 150 that provides time-synchronized data samples from the high-capacity sensors 112A and the replacement sensors 112B. In one implementation, the sensor simulation module 314 trains models that use the output of the sensor quality as a cue when determining which sensors to prioritize when different sensors have conflicting results. For example, a sensor simulation model may select images from a subset of replacement sensors 112 that have a sensor quality score above a threshold to simulate high-capacity sensor data.

In one embodiment, the sensor simulation models are trained to remove environmental effects from the replacement sensors 112B. In such an instance, the sensor simulation module 314 may request synthesized sensor data from the data synthesizing module 325 that include environmental effects such as "ice" or "rain" in sensor data from replacement sensors 112B. The sensor simulation module 314 can then train the sensor simulation models based on the synthesized replacement sensor data and a set of target outputs corresponding to high-capacity sensor images such that the model can simulate high-capacity sensor data from replacement sensor data even during occurrence of environmental effects.

The reconstruction module 315 trains reconstruction models that receive missing or incomplete sensor data from a particular sensor and output reconstructed sensor data for that sensor with the help of data produced by other sensors. In certain scenarios, sensors fail to capture objects and scenery in the environment. For example, LIDAR signals are attenuated by rain or fog. Camera and LIDAR sensors are hampered by direct sunlight. Active sensors such as RADAR and LIDAR may be corrupted by other sensors that use the same wavelength, such as other vehicles using the same type of RADAR sensor that can potentially cause interference. As another example, LIDAR sensors can fail to receive returns signals from a car on the road because the car has dark-colored paint, and the dark paint absorbs many of the photons emitted by the LIDAR. In many cases, these scenarios can result in sensor data in which portions of the sensor data are incomplete or missing. The reconstruction models reconstruct portions of incomplete or missing data from a sensor based on information received from other sensors to generate a refined version of the sensor data with respect to the sensing characteristics of the sensor. For example, the reconstruction module 315 may reconstruct the incomplete information of the dark-colored car in the LIDAR point-cloud and fill in these points for the LIDAR sensor using mutual information from other sensors (e.g. camera).

In one implementation, the reconstruction module 315 trains one or more neural network models as the reconstruction models. The reconstruction module 315 constructs a training data set that contains instances of sensor data from a set of sensor data for a given scene in which sensor data from one or more sensors in the set of sensors are incomplete. Each instance in the training data also contains a set of target outputs that correspond to the instances of sensor data from the one or more sensors that are reconstructed without the incomplete portions. Based on the training data set, the reconstruction module 315 can train reconstruction models to refine incomplete sensor data based on sensor data from the set of other sensors. Specifically, the reconstruction module 315 may train one or more neural network models as the reconstruction models.

In one embodiment, the reconstruction module 315 constructs the training data set by removing portions of sensor data for one or more sensors. For example, the reconstruction module 315 may delete a random subset of data from sensor data of one or more sensors, either automatically or by human operation. For example, the reconstruction module 315 may omit random portions of images from RGB cameras for a vehicle having a LIDAR sensor, the RGB camera, and a RADAR sensor. The training data set can consist of instances of sensor data from the set of LIDAR, RGB camera, and RADAR sensors of scenes in which portions of the RGB camera images have been deleted. Each set of images may be paired with original images from the RGB camera that have no deleted portions.

Figure 5:
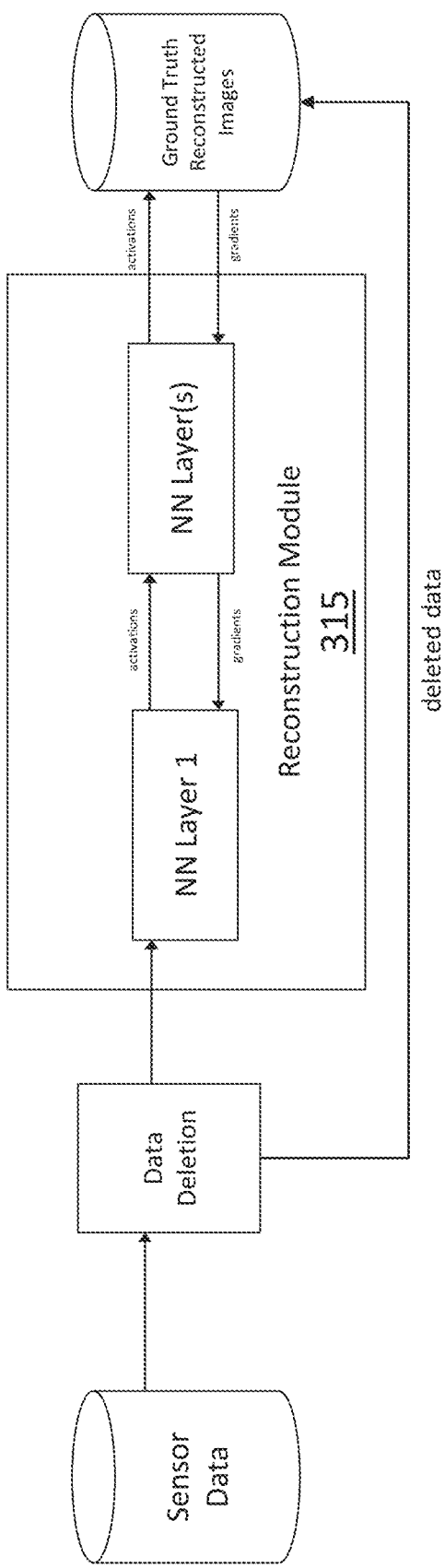
FIG. 5 illustrates an example process of training reconstruction models, in accordance with an embodiment.

FIG. 5 illustrates a process of training reconstruction models, in accordance with an embodiment. As shown in FIG. 5, the reconstruction module 315 constructs training data by deleting portions of sensor data from one or more sensors in a set of sensors. Each training data instance is paired with corresponding original sensor data without the missing portions. The reconstruction module 315 trains one or more neural network models that reconstruct missing portions in the sensor data of one or more sensors based on information provided by the other sensors.

In another embodiment, the reconstruction module 315 requests synthesized data from the data synthesizing module 325 to add artifacts into the sensor data. For example, the reconstruction module 315 may request synthesized sensor data that include data that reflect reduced image quality due to the simulated artifacts. For example, the reconstruction module 315 may request synthesized sensor data that simulate artifacts such as a dark-colored car, precipitation, and puddles on the road that generate incomplete sensor data in at least some portions of the image due to these artifacts. As another example, the synthesized sensor data may simulate snow on the road and direct sunlight shining into the sensors. In yet another embodiment, the synthesized sensor data can also reflect ideal data quality even with introduced artifacts. For example, the reconstruction module 315 may request synthesized sensor data that generate idealized LIDAR images given artifacts such as dark-colored cars, precipitation, and the like from the data synthesizing module 325. In such instances, the training data set may consist of instances of synthesized sensor data from a set of sensors that reflect the effect of artifacts on the one or more sensors, and corresponding instances of synthesized sensor data that simulate ideal sensor quality even in the presence of such artifacts.

The detection module 316 trains detection models that detect objects in the scene based on sensor data. In one embodiment, the detection models perform detection on collected or simulated high-capacity sensor data. In one instance, when the vehicle includes replacement sensors, the detection model is configured to receive simulated high-capacity sensor data from the sensor simulation module 314. In another instance, when the vehicle includes high-capacity sensors, the detection models are configured to receive the collected high-capacity sensor data, or in some cases, data that has been refined by the reconstruction module 315. Objects may include both stationary and moving items in the scenery of the physical environment. For example, stationary objects may include guard rails, road signs, or traffic cones. As another example, moving objects may include pedestrians, bicyclists, animals, or vehicles.

In one embodiment, the detection models detect objects using the following mechanism. First, the detection models identify regions of interest (ROIs) in the data which may contain objects. Next, the detection models determine which ROIs contain objects, and then it classifies the objects into categories such as guard rails, road signs, traffic cones, bicyclists, animals, or vehicles. The detection models may be convolutional neural network models to identify ROIs and classify objects. The detection models may perform further functionalities, such as tracking objects across multiple time steps of data.

In one embodiment, the detection module 316 constructs a training data set that contains instances of sensor data annotated with various objects such as cars, pedestrians, bicyclists, guard rails, and traffic signs. The detection module 316 trains the detection models that detect presence and location of specific categories of objects given an instance of sensor data. In one implementation, the objects in the training data set are labeled by human annotators. These annotations may be performed on top of the data from one or more sensors. For example, human annotators may label the objects within data collected from camera, LIDAR, RADAR, and/or other sensor types.

In another implementation, the detection module 316 may request training data in which additional objects are added and automatically annotated by the data synthesizing module 325. These objects may be rare or specialized objects (e.g. moose, alligators, traffic signs) or challenging optical illusions (e.g. pedestrians wearing silver-colored mirror-like clothing, billboards containing cars and bicycles). These objects are rendered on the sensors which have the objects in their field-of-view.

The segmentation module 317 trains segmentation models that semantically classify regions of the scene based on sensor data. In one embodiment, the segmentation models perform segmentation on the scene and, importantly, identifies regions of the sensor data that are drivable. In one implementation of this embodiment, the segmentation module 317 trains one or more neural networks to perform low-level semantic segmentation, which consists of classifying the type of object or surface that each point in the point cloud represents. Next, the segmentation models perform grouping or smoothing to create contiguous segments. The segmentation models further perform semantic analysis on the contiguous segments. For example, the road segmentation is further decomposed into lane-marking segments.

In one embodiment, the segmentation module 317 constructs a training data set that contains sensor data annotated with the precise borders of various segments such as the road surface, lane markings, cars, and off-road land. The segmentation module 317 trains the segmentation models that identify the type and precise border of each segment in the scene. In one implementation, the segments in the training data set are labeled by human annotators. These annotations may be performed on top of the data from one or more sensors. For example, human annotators may label the segments within data collected from camera, LIDAR, RADAR, and/or other sensor types.

In another implementation, the segmentation module 317 may request training data in which additional segments are added and automatically annotated by the data synthesizing module 325. These segments may be rare or specialized segments (e.g. unusual types of lane markings, debris in the road) or challenging optical illusions (e.g. a road displayed on a billboard, lane markings covered by pools of water). These segments are rendered on the sensors which have the segments in their field-of-view.

The control module 319 generates control models that determine the path that the robot or vehicle should follow, and it actuates the vehicle to follow the determined path. In one embodiment, the control models determine the path based on the objects and segments identified by the detection models and the segmentation models in the scene. The control models may be instantiated with a basic directive such as "safely make progress in the current lane, and change lanes or park on the shoulder if the current lane becomes unsafe," or an advanced directive such as "drive to a specific street address." The control models act on their directive by first plotting possible paths on the drivable terrain identified by the segmentation models. These paths may be identified using a motion planning algorithm such as Rapidly Exploring Random Tree (RRT) or A-Star. Next, the control models delete the paths that may conflict with objects on the road that are identified by the detection models. Then, the control models select the optimal path out of the current path set. Finally, the control models actuate the vehicle to follow the selected path. The control models may refresh its path list at a rate of once every few milliseconds.

Figure 6:
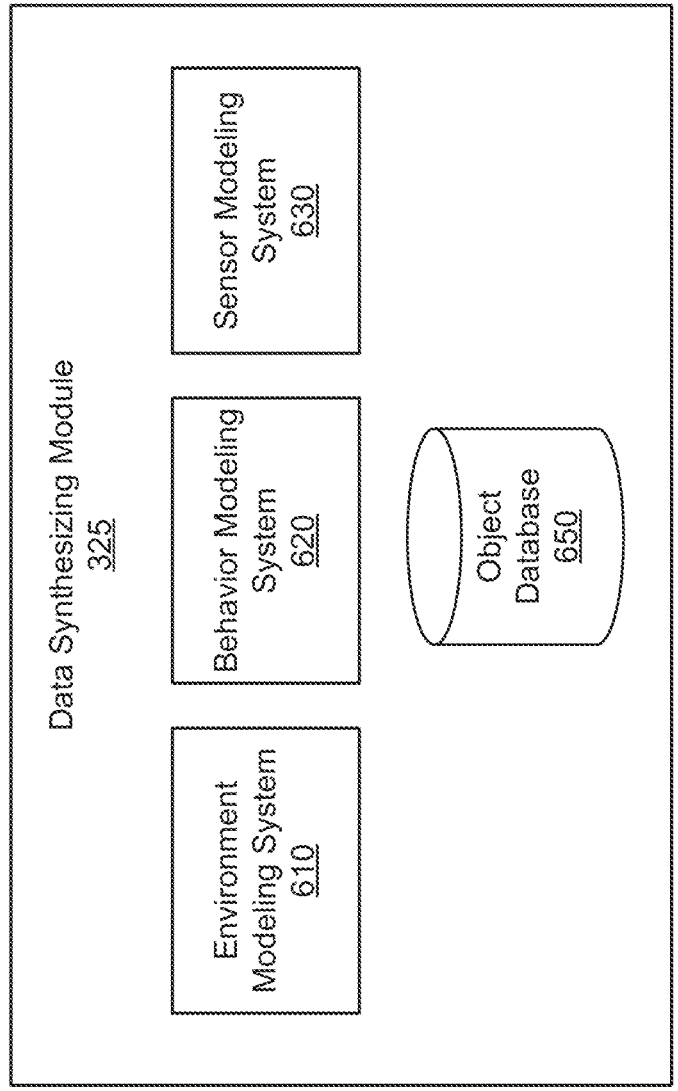
FIG. 6 is an example block diagram of an architecture of the data synthesizing module, in accordance with an embodiment.

FIG. 6 is an example block diagram of an architecture of the data synthesizing module 325, in accordance with an embodiment. The data synthesizing module 325 shown in FIG. 6 includes an environment modeling system 610, a behavior modeling system 620, and a sensor modeling system 630. The data synthesizing module 325 also includes an object database 650.

The environment modeling system 610 produces environments on which to simulate objects. Specifically, the environment modeling system 610 classifies regions of the environment, such as the ground plane, roads, sidewalks, and the like, to identify segments that objects can be placed on. The identified regions in the environment may be represented as a collection of points or as a collection of polygons. In one embodiment, when the data synthesis request is based on point-cloud sensor data of sensors that are collected by the sensor collection module 150, regions in the point-clouds are identified by segmentation models generated by the segmentation module 317. Human annotators may verify that the output of the semantic segmentation models are correct, and make edits to the segmentation output if necessary. In another embodiment, the environment modeling system 610 may simulate a virtual environment composed of different types of regions based on the received data synthesis request.

The object database 650 contains 3D models of objects, such as variants of pedestrians, vehicles, road debris, which can be placed into the scene.

The behavior modeling system 620 generates a scene by placing objects in the environment and modeling the behavioral motion of objects in the environment. The behavior modeling system 620 contains a behavior model for each object that is in the object database 650. In one implementation, the behavioral engine is parameterized such that "conservative" or "risky" behavior can be selected. For "risky" behavior (e.g. pedestrians that run into the road at random, cars that frequently run traffic lights), behaviors can be run in simulation that would be too dangerous to deliberately test in real (non-simulated) vehicles on real roads. The behavior modeling system 620 is also responsible for modeling natural forces such as gravity, as well as determining feasible movements and interactions of each object based on mass, momentum, and other properties in the environment.

The sensor modeling system 630 generates synthetic sensor data that simulate how sensors probe the scene constructed by the environment modeling system 610 and the behavior modeling system 620. In one instance, when the sensor is a camera with specific parameters such as focal length and field of view, the sensor modeling system 630 simulates the optics of the camera. A camera simulation has light sources (e.g. the position of the sun and any other lighting). In one implementation, the camera simulation is implemented by raytracing the path of the light from the light sources, through the environment, through the camera lens, and into the camera sensor.

In another instance, when the sensor is an active sensor, such as a LIDAR sensor, with specific limitations on range, resolution, and field-of-view, the sensor modeling system 630 simulates the signal intensity and range of the active sensor. The simulation can be implemented with raytracing such that the active sensor itself contains both the light source and the light detector. The sensor modeling system 630 can simulate the transmission of sensor signals in various directions, and the corresponding measurement of the reflected signals for each direction based on the interactions of the transmitted signal with objects placed in line with the signal. The limitations of the active sensor system, such as range, field-of-view, photons absorbed by dark objects, can be incorporated into the ray-tracing model.

In one embodiment, when artifacts are introduced into an already existing sensor data, the sensor modeling system 630 may choose to simulate sensor behavior for portions of the sensor data that correspond to the introduced artifacts, and modify the existing LIDAR image based on the simulated portion. For example, when a virtual puddle is simulated on an existing LIDAR image of a road, the sensor modeling system 630 may simulate sensor measurements only for LIDAR signals transmitted in a direction that would interact with the puddle. The sensor modeling system 630 can combine the simulated data with the existing LIDAR image to generate the synthesized image. For example, the sensor modeling system 630 can add the simulated data to a portion of the LIDAR image corresponding to the location of the virtual puddle, or replace the portion with the simulated data entirely.

In another implementation, the physics of the LIDAR is simulated in sufficient detail such that the limitations of the LIDAR, such as range, photons absorbed by dark objects result from the physics simulation. The sensor modeling system 630 can simulate sensor probing for other active sensors similarly to LIDAR sensors.

In another implementation, the sensor modeling system 630 refines synthetic LIDAR data that was generated using another approach. The sensor modeling system 630 performs this refinement using a convolutional neural network (CNN), deep neural network (DNN), generative adversarial network (GAN), or the like. This implementation is used when it is difficult to accurately simulate the physical characteristics of LIDAR, due to reasons such as those mentioned in the previous paragraph. As an example, the sensor modeling system 630 performs synthetic LIDAR refinement by first modeling the noise profile of a LIDAR module, using previously collected real sensor data. The sensor modeling system 630 then contributes realistic noise to synthetic LIDAR data.

In another instance, the sensor is a contemporary RADAR module. The RADAR module emits radio waves, the radio waves interact with the environment, and the RADAR module detects radio waves that return. The returns are initially represented as a raw waveform. In one implementation, the RADAR module has processing hardware that performs digital signal processing (DSP) algorithms such as a Fourier Transform to convert the raw waveform into a target list. A target list is stored as an array, where each array cell represents a quantized angular region (e.g. 125° to 126.5°) of the RADAR module's field of view. Each array cell contains information such as the range and/or trajectory of the object(s) in its quantized angular region. In one implementation, the sensor modeling system 630 simulates the physics of raw waveforms that are emitted and detected by the RADAR module. The physics of the RADAR is simulated in sufficient detail for the RADAR's behavior and limitations, such as resolution and sensitivity to clutter, emerge naturally from the simulation. This approach can model the RADAR's behavior accurately, but it can be quite computationally expensive.

In another implementation, the sensor modeling system 630 simulates the RADAR in a more computationally efficient way. If the sensor is a RADAR module with specific range, resolution, and field-of-view, then the RADAR simulation can be implemented by quantizing the output of the environment modeling system 410 and the behavior modeling system 630 into the quantized angular regions that are visible to the RADAR.

In another implementation, the sensor modeling system 630 simulates the RADAR using a learned model, which may be a CNN, DNN, GAN or the like. Given real or synthetic LIDAR as input, the learned model predicts the corresponding synthetic RADAR sensor data. This approach can simulate arbitrary RADAR modules, such as Range-Doppler maps and the like. As an example, a learned model is trained using real LIDAR and real RADAR data. To simulate synthetic RADAR data, the sensor modeling system 630 generates LIDAR data using any approach. Then, the sensor modeling system 630 uses the learned model to simulate a proprietary RADAR module from a vendor where there is no accurate physical model of the module.

The sensor modeling system 630 is also capable of simulating idealized sensors that are not limited by the constraints of current sensing technology. For example, when simulating a real-world camera, the simulated camera captures low-quality data when faced with darkness or direct sunlight. However, an idealized camera is not susceptible to these issues and provides high-quality imaging in all conditions. As another example, when simulating a real-world LIDAR sensor, the sensor experiences attenuation when faced with dark colored objects or scenery that is beyond the LIDAR sensor's range. However, the sensor modeling system 630 can simulate an idealized LIDAR sensor that is not susceptible to these issues. In one embodiment, the sensor modeling system 630 simulates an idealized LIDAR sensor as a raytracer that has infinite range and where all photons return to the detector. In another embodiment, the sensor modeling system 630 simulates a LIDAR sensor with infinite range.

What is claimed is:

1. A method implemented by a system of one or more processors, the system providing autonomous or semi-autonomous control of a vehicle, wherein the method comprises: obtaining vehicle sensor data from a plurality of sensors during operation of the vehicle, the sensors being located on the vehicle and configured to detect information related to a real-world environment proximate to the vehicle; providing the vehicle sensor data to one or more computer models, the one or more computer models comprising model data that was trained using synthetic sensor data modified to simulate one or more types of artifacts; and applying the one or more computer models to the vehicle sensor data to provide autonomous or semi-autonomous control of the vehicle based on output from the one or more computer models.

2. The method of claim 1, wherein the vehicle sensor data is synthesized from the plurality of sensors comprising one or more of a camera, a microphone, a radar, or a LIDAR.

3. The method of claim 1, wherein the synthetic sensor data comprises sensor data from a particular sensor, wherein the sensor data was modified to simulate a particular type of artifact, and wherein the one or more computer models were trained to remove the particular type of artifact.

4. The method of claim 3, wherein the one or more computer models were trained to output sensor data with the particular type of artifact removed based on input of sensor data from the particular sensor.

5. The method of claim 1, wherein the one or more types of artifacts include missing data included in sensor data from a particular sensor of the plurality of sensors.

6. The method of claim 5, wherein the one or more computer models output a reconstruction of the missing data based on sensor data from one or more remaining sensors of the plurality of sensors.

7. The method of claim 6, wherein the particular sensor is a LIDAR, and wherein the missing data is associated with a dark-colored vehicle in the real-world environment.

8. The method of claim 6, wherein the particular sensor is a LIDAR, wherein the missing data is associated with attenuation of LIDAR signals, and wherein the remaining sensors comprise one or more cameras.

9. The method of claim 1, wherein a type of artifact comprises atmospheric conditions, lighting conditions, and/or objects.

10. The method of claim 9, wherein atmospheric conditions comprise one or more of precipitation, iciness or snow.

11. The method of claim 9, wherein lighting conditions comprise one or more of sunlight or darkness.

12. The method of claim 9, wherein objects comprise pedestrians or puddles.

13. The method of claim 1, wherein the computer models determine quality scores associated with sensor data from the plurality of sensors, and wherein the computer models use the quality scores to prioritize individual sensors of the plurality of sensors.

14. The method of claim 13, wherein the quality score for a particular sensor is based on lighting conditions and/or interface with one or more remaining sensors.

15. A system comprising a processor and non-transitory computer storage media storing instructions that when executed by the processor, cause the processor to perform operations, wherein the system is configured to guide a vehicle via autonomous or semi-autonomous control, and wherein the operations comprising: obtaining vehicle sensor data from a plurality of sensors during operation of the vehicle, the sensors being located on the vehicle and configured to detect information related to a real-world environment proximate to the vehicle; providing the vehicle sensor data to one or more computer models, the one or more computer models comprising model data that was trained using synthetic sensor data modified to simulate one or more types of artifacts; and applying the one or more computer models to the vehicle sensor data to provide autonomous or semi-autonomous control of the vehicle based on output from the one or more computer models.

16. The system of claim 15, wherein the vehicle sensor data is synthesized from the plurality of sensors comprising one or more of a camera, a microphone, a radar, or a LIDAR.

17. The system of claim 15, wherein the one or more types of artifacts include missing data included in sensor data from a particular sensor of the plurality of sensors.

18. The system of claim 17, wherein the particular sensor comprises a LIDAR, wherein the one or more computer models output a reconstruction of the missing data based on sensor data from one or more remaining sensors of the plurality of sensors, and wherein the remaining sensors comprise one or more cameras.

19. Non-transitory computer storage media storing instructions that when executed by a processor cause the process to perform operations, the processor being configured to guide a vehicle via autonomous or semi-autonomous control, and wherein the operations comprising: obtaining vehicle sensor data from a plurality of sensors during operation of the vehicle, the sensors being located on the vehicle and configured to detect information related to a real-world environment proximate to the vehicle; providing the vehicle sensor data to one or more computer models, the one or more computer models comprising model data that was trained using synthetic sensor data modified to simulate one or more types of artifacts; and applying the one or more computer models to the vehicle sensor data to provide autonomous or semi-autonomous control of the vehicle based on output from the one or more computer models.

20. The computer-storage media of claim 19, wherein the vehicle sensor data is synthesized from the plurality of sensors comprising one or more of a camera, a microphone, a radar, or a LIDAR.

* * * * *